US011532619B2

(12) United States Patent
Rachmady et al.

(10) Patent No.: US 11,532,619 B2
(45) Date of Patent: Dec. 20, 2022

(54) TRANSISTOR STRUCTURES INCLUDING A NON-PLANAR BODY HAVING VARIABLE AND COMPLEMENTARY SEMICONDUCTOR AND INSULATOR PORTIONS

(71) Applicant: Intel Corporation, Santa Clara, CA (US)

(72) Inventors: Willy Rachmady, Beaverton, OR (US); Cheng-Ying Huang, Hillsboro, OR (US); Gilbert Dewey, Hillsboro, OR (US); Jack Kavalieros, Portland, OR (US); Caleb Barrett, Hillsboro, OR (US); Jay P. Gupta, Hillsboro, OR (US); Nishant Gupta, Hillsboro, OR (US); Kaiwen Hsu, Santa Clara, CA (US); Byungki Jung, Portland, OR (US); Aravind S. Killampalli, Beaverton, OR (US); Justin Railsback, Santa Clara, CA (US); Supanee Sukrittanon, North Plains, OR (US); Prashant Wadhwa, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 753 days.

(21) Appl. No.: 16/367,175

(22) Filed: Mar. 27, 2019

(65) Prior Publication Data

US 2020/0312841 A1   Oct. 1, 2020

(51) Int. Cl.
*H01L 27/088* (2006.01)
*H01L 29/06* (2006.01)
(Continued)

(52) U.S. Cl.
CPC .... *H01L 27/0886* (2013.01); *H01L 21/02614* (2013.01); *H01L 21/823431* (2013.01);
(Continued)

(58) Field of Classification Search
CPC ..... H01L 21/823437; H01L 21/823412; H01L 29/0649; H01L 21/02614; H01L 27/0886;
(Continued)

(56) References Cited

U.S. PATENT DOCUMENTS 9,660,033 B1 *  5/2017  Chen ................... H01L 29/7853
9,972,494 B1 *  5/2018  Bentley ............. H01L 29/66666
(Continued)

*Primary Examiner* — Mouloucoulaye Inoussa
(74) *Attorney, Agent, or Firm* — Essential Patents Group, LLP

(57) ABSTRACT

Transistor structures including a non-planar body that has an active portion comprising a semiconductor material of a first height that is variable, and an inactive portion comprising an oxide of the semiconductor material of a second variable height, complementary to the first height. Gate electrodes and source/drain terminals may be coupled through a transistor channel having any width that varies according to the first height. Oxidation of a semiconductor material may be selectively catalyzed to convert a desired portion of a non-planar body into the oxide of the semiconductor material. Oxidation may be enhanced through the application of a catalyst, such as one comprising metal and oxygen, for example.

14 Claims, 12 Drawing Sheets

(51) Int. Cl.
*H01L 29/16* (2006.01)
*H01L 29/78* (2006.01)
*H01L 21/02* (2006.01)
*H01L 21/8234* (2006.01)
*H01L 29/423* (2006.01)

(52) U.S. Cl.
CPC ........... *H01L 21/823437* (2013.01); *H01L 21/823481* (2013.01); *H01L 29/0649* (2013.01); *H01L 29/16* (2013.01); *H01L 29/42356* (2013.01); *H01L 29/7851* (2013.01)

(58) Field of Classification Search
CPC ........... H01L 29/7851; H01L 27/1207; H01L 21/823431; H01L 29/16; H01L 29/42356; H01L 21/823481; H01L 27/1211; H01L 29/66795; H01L 21/02164; H01L 21/02238; H01L 21/3086; H01L 29/775; H01L 29/66439; H01L 21/0262; H01L 29/785; H01L 21/02529; H01L 29/66545; H01L 29/78696; H01L 21/823814; H01L 21/02532; H01L 29/6656; H01L 27/092; H01L 29/6681; H01L 29/165; H01L 21/02636; H01L 21/823807; H01L 21/823878; H01L 29/1033; H01L 29/0653; H01L 29/42392; H01L 21/823468; H01L 21/823842; H01L 29/7848; H01L 29/66666; H01L 29/7827; H01L 21/32134; H01L 29/66742; H01L 21/26513; H01L 21/32139; H01L 29/78618; H01L 29/78642; H01L 21/28123; H01L 29/41791; H01L 29/0847; H01L 23/481; H01L 29/401; H01L 29/4175; H01L 29/66492; H01L 21/311; H01L 21/823487; H01L 21/823462; H01L 21/3213; H01L 27/088; H01L 21/823456; H01L 29/4983; H01L 29/78; H01L 29/7856; G11C 11/419

USPC .............. 257/9, 192, 330, 329, 369, E21.19, 257/E29.262; 438/212, 283, 479, 595, 438/200, 209; 977/762, 840
See application file for complete search history.

(56) References Cited

U.S. PATENT DOCUMENTS

| | | | |
|---|---|---|---|
| 10,249,538 B1* | 4/2019 | Qi | H01L 21/311 |
| 11,322,409 B2* | 5/2022 | Chang | H01L 29/66439 |
| 2010/0264496 A1* | 10/2010 | Thomas | H01L 29/78696 |
| | | | 257/E27.098 |
| 2011/0031473 A1* | 2/2011 | Chang | B82Y 10/00 |
| | | | 257/E27.098 |
| 2013/0153993 A1* | 6/2013 | Chang | H01L 29/66795 |
| | | | 257/329 |
| 2013/0270512 A1* | 10/2013 | Radosavljevic | H01L 29/775 |
| | | | 438/212 |
| 2013/0313513 A1* | 11/2013 | Cappellani | H01L 29/0673 |
| | | | 438/479 |
| 2014/0197377 A1* | 7/2014 | Kim | H01L 29/66439 |
| | | | 257/29 |
| 2014/0312432 A1* | 10/2014 | Ching | H01L 29/785 |
| | | | 257/288 |
| 2015/0028426 A1* | 1/2015 | Ching | H01L 29/66795 |
| | | | 438/283 |
| 2015/0303198 A1* | 10/2015 | Ching | H01L 21/823821 |
| | | | 257/192 |
| 2016/0093726 A1* | 3/2016 | Ching | H01L 29/7848 |
| | | | 257/192 |
| 2016/0204195 A1* | 7/2016 | Wen | H01L 29/66439 |
| | | | 438/157 |
| 2017/0194213 A1* | 7/2017 | Ching | H01L 21/823821 |
| 2017/0200738 A1* | 7/2017 | Kim | H01L 27/1211 |
| 2018/0151452 A1* | 5/2018 | Doorn | B82Y 10/00 |
| 2018/0190835 A1* | 7/2018 | Lee | H01L 29/66795 |
| 2018/0350992 A1* | 12/2018 | Ching | H01L 29/0653 |
| 2019/0051729 A1* | 2/2019 | Zhou | H01L 29/785 |
| 2019/0123160 A1* | 4/2019 | Xie | H01L 29/66772 |
| 2020/0006333 A1* | 1/2020 | Noh | H01L 21/3086 |
| 2021/0098311 A1* | 4/2021 | Lin | H01L 21/823821 |

\* cited by examiner

TRANSISTOR STRUCTURES INCLUDING A NON-PLANAR BODY HAVING VARIABLE AND COMPLEMENTARY SEMICONDUCTOR AND INSULATOR PORTIONS

BACKGROUND

Device density in integrated circuits (ICs) has increased for decades in conformance with Moore's law. Within the last few MOSFET technology generations, transistors evolved from utilizing a planar semiconductor surface to non-planar semiconductor body, thereby making the channel width of the transistor a function of a height of the non-planar body. With this advancement, it has become more difficult to vary the transistor channel width arbitrarily, and today most channel width variation is implemented in a discretized fashion by coupling together an integer number of non-planar semiconductor bodies that each have a predetermined, fixed, channel width. Such discretization places an additional constraint on the design of CMOS circuit architecture.

While some effort has been made toward varying the height of a non-planar semiconductor body as a means of recovering greater control over the transistor channel width, most approaches to do so have faced practical problems. For example, some techniques developed to vary the height of a non-planar transistor body have been found to negatively impact the fabrication of other transistor structures, such as a gate electrode, that may be sensitive to body height variation.

Techniques and architectures that can enable a menu of non-planar transistor channel widths without further requiring significant alteration of other fabrication modules and/or transistor structures would be advantageous for at least greater flexibility in the architecture of CMOS circuitry.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
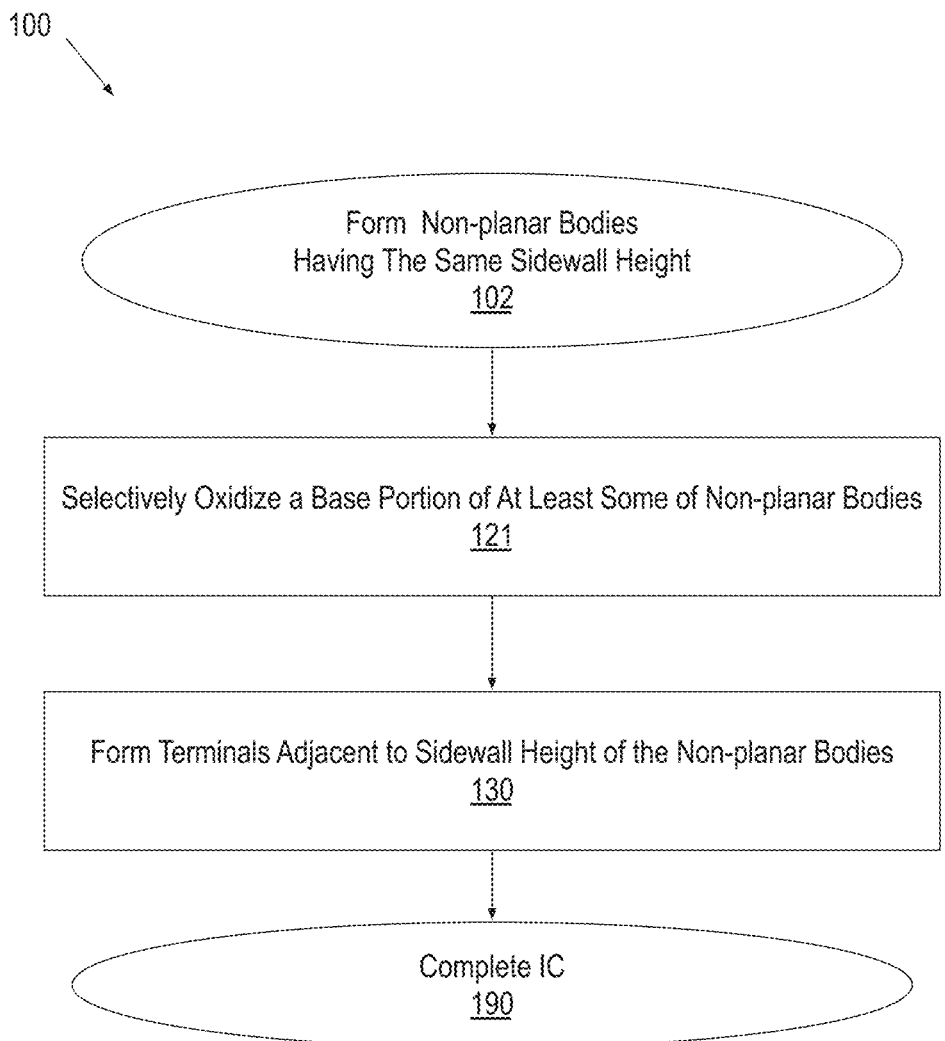
FIG. 1A is a flow diagram illustrating methods of forming transistor structures including non-planar bodies having variable, and complementary, semiconductor and insulator portions, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistor structures including a non-planar body that has an active portion comprising a semiconductor material of a first height, and an inactive portion comprising an oxide of the semiconductor material of a second height are described herein. The first and second heights may be varied in a manner substantially complementary to each other to implement transistors of different channel widths. The active portion of a non-planar body may range from 100% down to 10%, or less, for example, with the inactive portion of the non-planar body then having a corresponding range from 0% to 90%, or more. The first and second heights may sum to a non-planar body height that is nearly constant over a plurality of transistors, for example with variation of less ~10% over a plurality of non-planar bodies having active portions that range from 10% to 100% (e.g., 25%). With the active portion of a non-planar body more nearly independent of the non-planar body height, other transistor structures, such as gate electrodes and/or source or drain terminals may be more readily fabricated while nevertheless ultimately coupling through a transistor channel that is free to have a wide range of widths that varies according to a height of the active portion.

In some embodiments, thermal oxidation of a semiconductor material may be selectively catalyzed to convert a desired portion of a non-planar body of a predetermined height into an oxide of the semiconductor material, thereby forming the inactive portion of the non-planar body. As described further below, oxygen diffusion within a semiconductor material during a thermal oxidation process may be catalyzed, enhancing the oxidation rate within a portion of a non-planar body that is to be made inactive. Oxygen diffusion may be enhanced, for example, through the selective application or retention of a catalyst on a surface of the non-planar body that is to be oxidized more rapidly.

FIG. 1A is a flow diagram illustrating methods 100 for forming transistor structures including non-planar bodies having variable, and complementary, semiconductor and insulator portions, in accordance with some embodiments. Methods 100 begin at block 102 where multiple non-planar bodies (e.g., fins) are formed from a semiconductor material layer of a substrate. The substrate may be a wafer of any diameter (e.g., 300 mm, 450 mm, etc.). The semiconductor material layer may be a portion of a bulk semiconductor substrate or may be a top layer of a semiconductor-on-insulator (SOI) substrate, for example. The non-planar bodies may be formed at block 102 with any fabrication technique that is applied to all of the bodies so that they may all have substantially the same initial sidewall height (e.g., neglecting some nominal process variation).

At block 121, a lower portion of at least some the non-planar bodies is oxidized to convert the semiconductor material within the non-planar bodies formed at block 102 into a dielectric. A remaining, substantially unoxidized, upper portion of the non-planar bodies retains the semiconductor material over some active sidewall height, reduced from the initial sidewall height. The dielectric formed within the lower body portion may electrically insulate the upper body portion from an underlying semiconductor material of the substrate. The oxidation performed at block 121 may entail a thermal cycle, and/or any oxidizing environment. The oxidation at block 121 may alter only some of the non-planar bodies, with one or more of the bodies remaining substantially as formed at block 102 (e.g., retaining the initial sidewall height). Furthermore, the oxidation at block 121 may alter different proportions of the initial non-planar body heights, thereby generating a number of different active area heights from non-planar bodies that had substantially equal initial heights.

The oxidization of block 121 may be made selective in any manner. In some advantageous embodiments an oxidation catalyst is deposited over the lower portion of the non-planar bodies that is to be fully oxidized. The oxidation catalyst may, for example enhance oxygen diffusion into the semiconductor material, or otherwise promote a more rapid oxidation of the semiconductor material underlying the catalyst. Alternatively, an oxidation mask material may be deposited over an upper portion of the non-planar bodies that is to be under-oxidized while the lower portion of the non-planar bodies is allowed to more fully oxidize in the absence of the oxidation mask material. Aside from volumetric differences between the semiconductor material and its oxidized dielectric form, the non-planar bodies generated by block 121 may retain nearly the same total sidewall height (e.g., their initial height) with only an active portion of that sidewall height still being semiconductor material while a complementary, inactive, portion of that sidewall height is an oxidized dielectric material. The active and inactive sidewall heights are referred to herein as "complementary" because one summed with the other equals a total sidewall height that may be substantially the same over many non-planar bodies that have varying active and inactive sidewall heights. With a substantially constant total sidewall height, for any increase in the sidewall height of the oxidized, inactive, dielectric material there is a concomitant decrease in the sidewall height of the unoxidized, active semiconductor material, and vice versa.

Methods 100 continue at block 130 where transistor terminals are formed. For example, gate electrodes may be fabricated based on the initial sidewall height that was substantially the same across all the non-planar bodies formed at block 102, regardless of whether a base portion of some of the bodies was subsequently oxidized at block 121. The gate electrode fabrication may therefore proceed based on a predetermined sidewall height of the non-planar bodies independent of an apportionment of that initial sidewall height between active and inactive portions. Source and drain fabrication may likewise proceed based on the initial sidewall height of the non-planar bodies independent of apportionment of that initial sidewall height between active and inactive portions. Transistor terminal fabrication may therefore easily accommodate differences in active channel heights across a plurality of non-planar bodies, with these differences being ultimately manifested as various predetermined channel widths.

Methods 100 end at block 190 where an integrated circuit comprising the transistors with multiple channel widths are completed, for example with any suitable back-end-of-line (BEOL) fabrication techniques employed to form interconnect metallization and interlayer dielectrics (ILDs), for example.

Figure 1B:
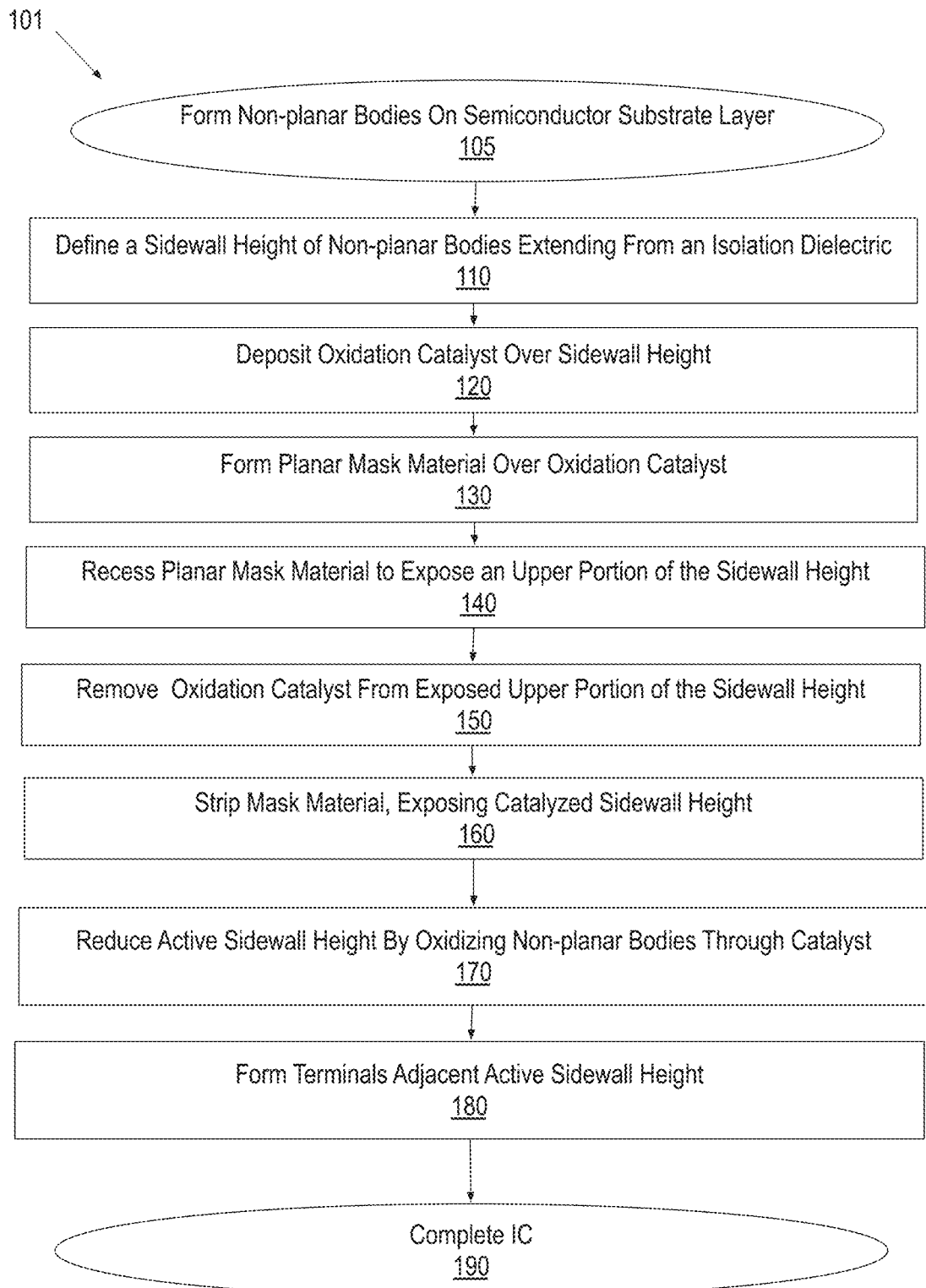
FIG. 1B is a flow diagram illustrating methods of forming transistor structures including non-planar bodies having variable and complementary semiconductor and insulator portions, in accordance with some embodiments.

FIG. 1B is a flow diagram illustrating methods 101 for forming transistor structures including non-planar bodies having variable, and complementary, semiconductor and insulator portions, in accordance with some embodiments. FIG. 1B illustrates some exemplary implementations of the more general methods 100. Methods 101 are further illustrated in FIG. 2-13, which are isometric views of two transistor structures evolving as blocks of methods 101 are practiced. The transistor structures include non-planar bodies having different semiconductor and insulator portions to further illustrate various structural relationships associated with transistors fabricated according to methods 101.

Referring first to FIG. 1B, methods 101 begin at block 105 where non-planar bodies are formed on a semiconductor substrate layer. The semiconductor substrate layer may be masked and then etched, for example with any anisotropic etch process known to be suitable for the semiconductor material. As further illustrated in the example of FIG. 2, transistor structures 200 include first semiconductor bodies 206 and second semiconductor bodies 207, along with an intervening semiconductor body 208, which may all be fabricated concurrently with any suitable masking and etching process(es).

Non-planar bodies 206-208 are patterned into a front (top) side of substrate material layer 205. Optionally, substrate material layer 205 is one substrate layer of a substrate that further includes one or more underlying substrate material layers 201. In some embodiments where substrate layer 201 is present, substrate layer 201 is an insulator such that substrate material layers 205 and 201 comprise a semiconductor-on-insulator (SOI) substrate structure. In other embodiments where substrate layer 201 is absent, substrate material layer 205 may be a top material layer of a bulk semiconductor substrate.

In some embodiments, substrate material layer 205 is a crystalline semiconductor. Although the crystalline semiconductor may be a polycrystalline thin film, in some exemplary embodiments the crystalline semiconductor is substantially monocrystalline. Non-planar bodies 206-208 may therefore also be substantially monocrystalline semiconductor material. In some embodiments, the crystallinity of substrate material layer 205 and non-planar bodies 206-208 is cubic with a top (front) surface having crystallographic orientation of (100), (111), or (110), for example. However, other crystallographic orientations are also possible.

In some embodiments, substrate material layer 205 is a group IV semiconductor, such as, but not limited to substantially pure silicon (e.g., having only trace impurities), silicon alloys (e.g., SiGe), or substantially pure germanium (e.g., having only trace impurities). In other embodiments substrate material layer 205 is a Group III-V alloy with a first sub-lattice of at least one element from group III of the periodic table (e.g., Al, Ga, In, etc.), and a second sub-lattice of at least one element of group V of the periodic table (e.g., N, P, As, Sb, etc.). Non-planar bodies 206-208 may therefore also have any of these same compositions. Although bodies 206-208 may each be of a substantially homogenous composition, bodies 206-208 may alternatively comprise one or more semiconductor heterojunctions that further include a first semiconductor material on a second semiconductor material. Bodies 206-208 may further comprise one or more dielectric mask materials (not depicted), which may either be ultimately removed (e.g., prior to formation of a gate electrode), or retained in a final transistor structure.

Substrate material layer 205 and non-planar bodies 206-208 may each have any conductivity type and have any impurity doping level. In some embodiments, non-planar bodies 206 and 207 are both substantially intrinsic semiconductor, or substantially undoped with electrically active impurities. In some NMOS embodiments, non-planar bodies 206 and 207 are intrinsic silicon, or are slightly p-type. In some PMOS embodiments, non-planar bodies 206 and 207 are intrinsic silicon, or are slight n-type. In some NMOS embodiments, non-planar bodies 206 have p-type conductivity and non-planar bodies 207 have n-type conductivity. Although bodies 206 and 207 may be of a substantially homogenous impurity doping, bodies 206 and 207 may alternatively comprise one or more semiconductor homojunctions that further include a first impurity doping concentration of first conductivity type (e.g., p-type or n-type) interfacing a second impurity doping concentration of a second, complementary conductivity type (e.g., n-type or p-type).

Figure 2:
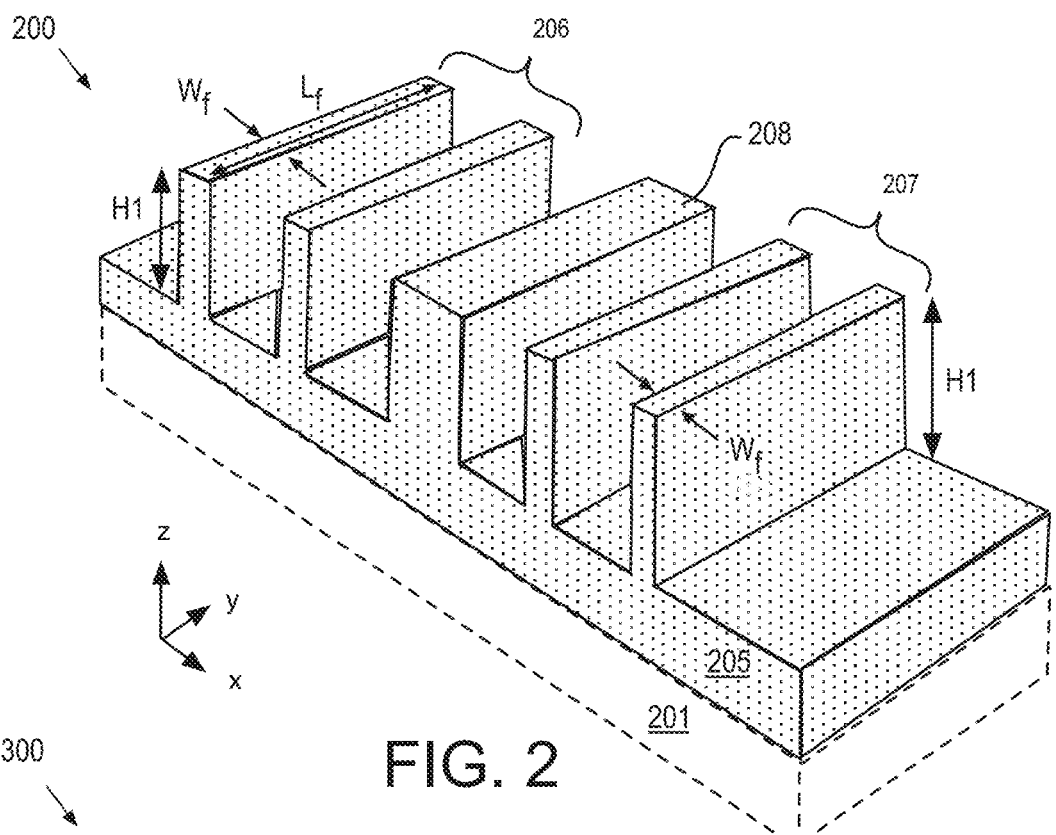
FIG. 2-13 illustrate isometric views of transistor structures evolving to include non-planar bodies having variable, and complementary, semiconductor and insulator portions, in accordance with some embodiments.
Figure 3:
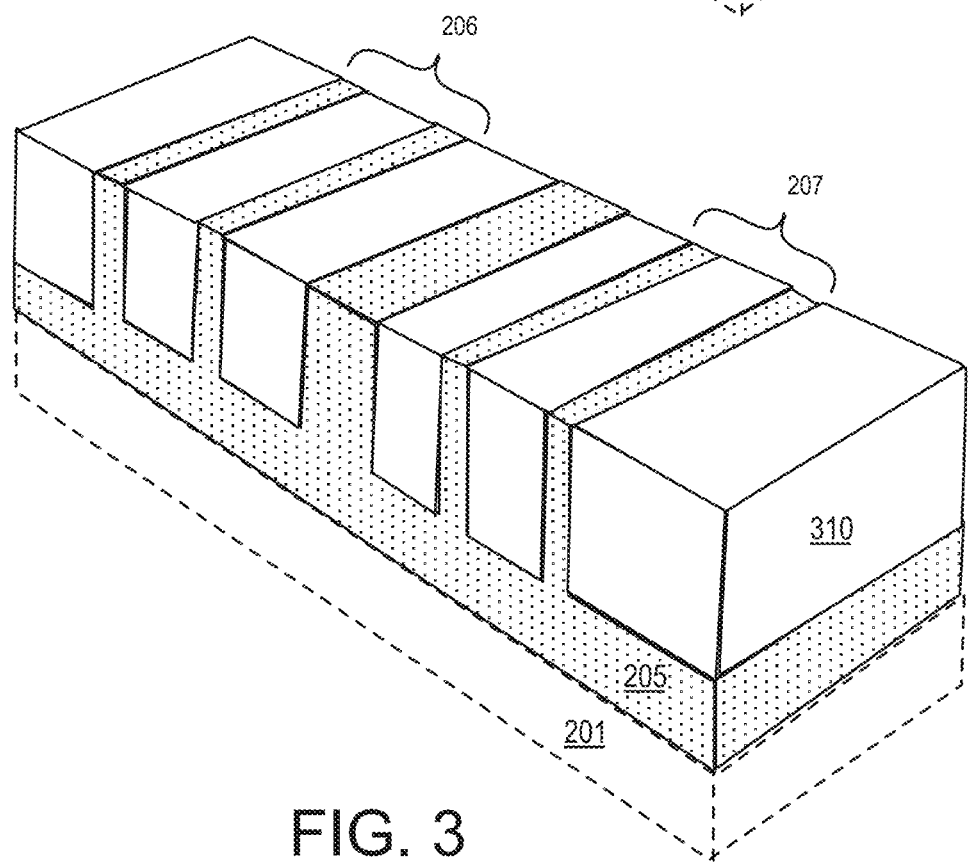

As shown in FIG. 2, following the patterning process, non-planar bodies 206 and 207 all have the same transverse width $W_f$, same longitudinal length $L_f$, and same initial sidewall height HE In some examples, transverse width $W_f$ is between 4 nm and 15 nm while sidewall height H1 is between 25 nm and 100 nm. In the embodiments illustrated, bodies 206 and 207 are fins that have a longitudinal length $L_f$ longer than their transverse width $W_f$, however bodies 206 and 207 may instead have any non-planar (3D) shape.

Returning to FIG. 1B, methods 101 continue at block 110 where field isolation is formed over the substrate material layer 205, and between adjacent non-planar bodies. Any trench isolation (e.g., STI) process may be practiced at block 110, for example, to form a dielectric material around a base portion of the non-planar bodies fabricated at block 110. In the example illustrated in FIG. 3, transistor structures 300 include an isolation dielectric material 310 that has been applied over transistor structures 200. Dielectric material 310 may comprise one or more dielectric material layers suitable for electrical isolation of transistors such as, but not limited to, SiO, SiN SiON, SiOC, hydrogen silsesquioxane, methyl silsesquioxane, polyimide, polynorbornenes, benzocyclobutene, or the like. Dielectric material 310 may be deposited as a flowable oxide, for example, and be substantially planarized with a front (top) surface of non-planar bodies 206-208. Once planarized, dielectric material 310 may be selectively etched to define a maximum channel width associated with an active portion of the non-planar bodies. Any wet or dry etch process suitable for the chosen dielectric material may be employed.

Figure 4:
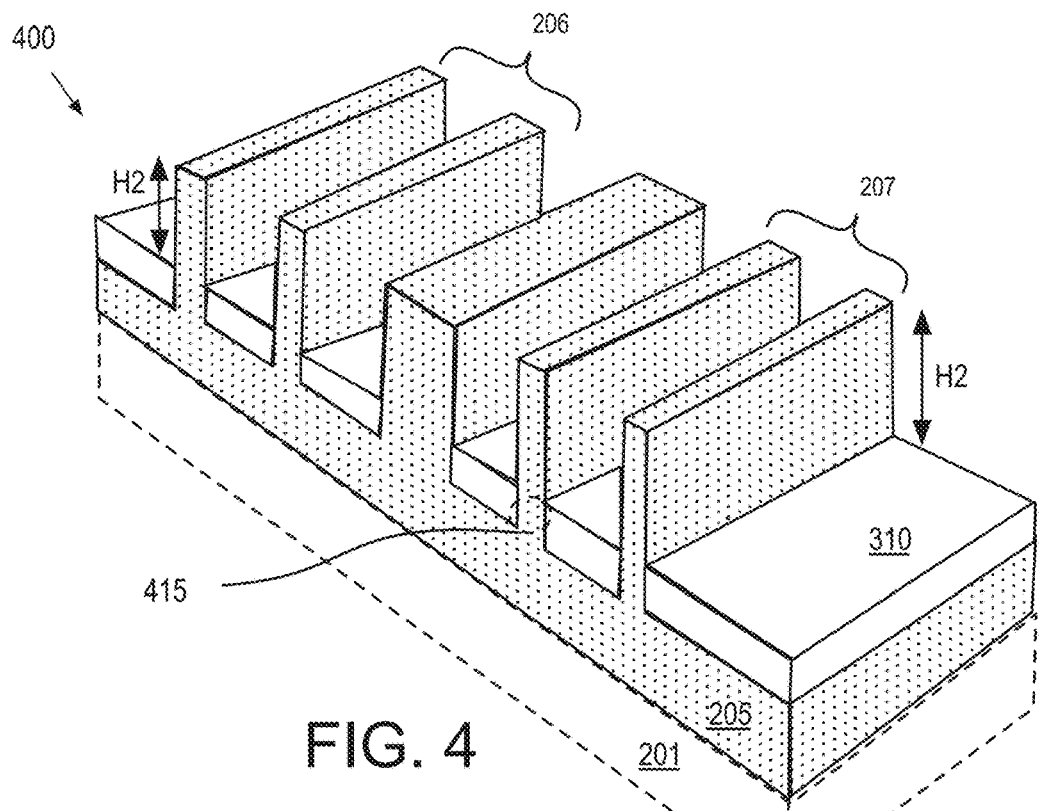

FIG. 4, for example, illustrates a transistor structures 400 that include transistor structures 300 following a recess etch of dielectric material 310. The recess etch exposes a sidewall height H2 of each of non-planar bodies 206 and 207. H2 is less than H1, and may vary from 25 nm to 50 nm in some exemplary embodiments where $W_f$ is 2-15 nm, for example. As described further below, H2 is associated with a maximum channel height of an active portion of any non-planar bodies on substrate material 205. Further fabrication processes may selectively reduce a transistor's sidewall height from H2 associated with a variety of other, lesser channel widths, as described further below. Below sidewall height H2, is a base portion, or "sub-fin" portion 415 of non-planar bodies 206-208 that is adjacent to dielectric material 310. Where H2 is 25 nm-50 nm, base portion 415 may have a sidewall height of 10-30 nm, for example.

Returning to FIG. 1B, methods 101 continue at block 120 where an oxidation catalyst is applied over the non-planar bodies to cover, or be in contact with, at least a portion of the non-planar sidewall heights. Any deposition process known to be suitable for the catalyst composition and desired catalyst layer thickness may be employed at block 120. In some embodiments, the catalyst comprises one or more metal and oxygen. In some such embodiments, the catalyst is a compound of a metal and oxygen (i.e., a metal oxide). In some such embodiments, the catalyst is deposited with a physical vapor deposition (PVD) process. In some other embodiments, the catalyst is deposited with a chemical vapor deposition (CVD) process. In other embodiments, the catalyst is deposited with a plasma enhanced CVD (PECVD) process. In still other embodiments, the catalyst is deposited with an atomic layer deposition (ALD) process. Noting that the sidewalls of the non-planar bodies are to be covered with the catalyst, more conformal deposition techniques, such as CVD and ALD, may offer advantages over less conformal deposition techniques, such as PVD.

Figure 5:
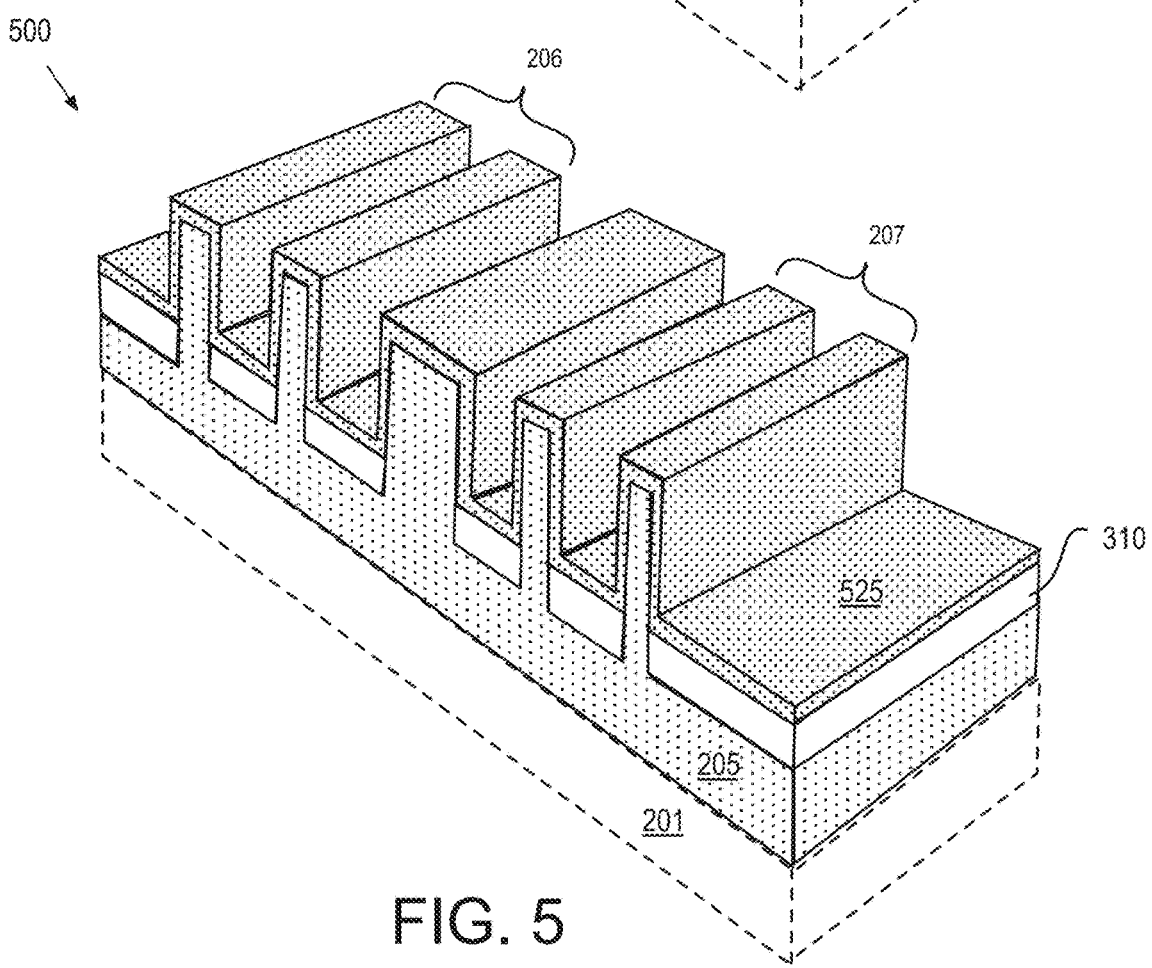

FIG. 5 illustrates transistor structures 500 that include an oxidation catalyst 525, which has been applied over transistor structures 400. The exemplary oxidation catalyst 525 includes one or more metal constituent and oxygen. Although the metal constituent may vary, some examples include the middle transition metals, the lanthanides, and aluminum. Some specific embodiments include an oxide of at least one of La, Al, or Ta. One aluminum oxide embodiment that the inventors have found to promote the oxidation of silicon is $Al_2O_3$. In some embodiments, the catalyst is deposited to a thickness less than 5 nm (e.g., 1 nm-5 nm of $Al_2O_3$). As shown in FIG. 5, oxidation catalyst 525 is in direct contact with sidewall height H2 of each of the non-planar bodies 206-208.

Returning to FIG. 1B, methods 101 continue with a selective removal of the oxidation catalyst. For example, at block 130 a mask material is deposited over the non-planar bodies. At block 140, the planar mask material is recessed to expose some predetermined portion of the sidewall heights H2. In some examples, the mask recession process is itself a masked process so that the amount of recess may be varied across different transistor structures. The mask material may be a carbon-based material applied with a spin-on technique to be initially substantially planar with a top surface of the non-planar bodies. Different amounts of recess may be implemented through a variety of selective etch techniques so that the planar mask material may be recessed to any number of different recess depths. These different recess depths may ultimately define the apportionment of the initial non-planar body height between active and inactive portions.

Figure 6:
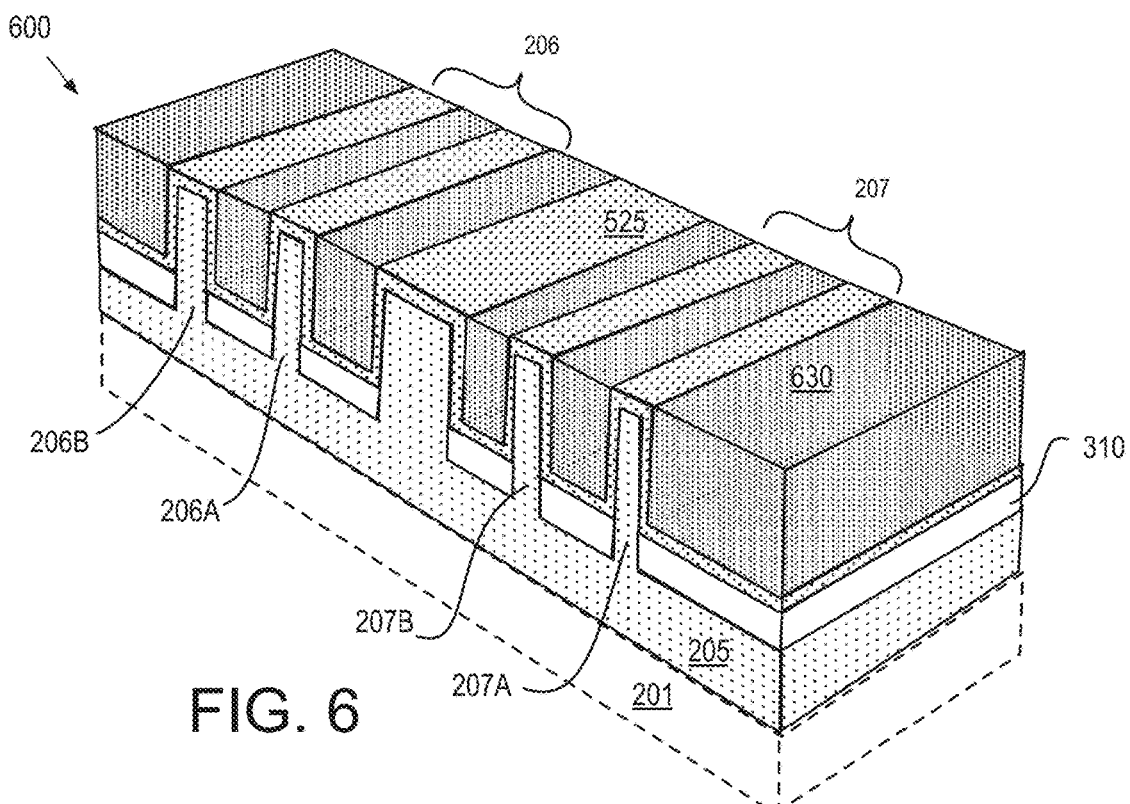

For the example shown in FIG. 6, transistor structures 600 include a mask material 630 that has been applied over transistor structures 500. Mask material 630 is substantially planar with a top (front) side of semiconductor bodies 206 and 207. As deposited, mask material 630 covers oxidation catalyst 525 that is on the sidewalls of semiconductor bodies 206 and 207. Mask material 630 is then to be recessed by any number of differing amounts, from relatively little recess for transistor structures of minimum channel height to complete recess (i.e., removal) for transistor structures of maximum channel height. An additional mask material (not depicted) may, for example, be applied over the planarized mask material within some regions of the substrate (e.g., over non-planar bodies 207). A first recess etch of mask material 630 may then be performed to reach some target depth within an unmasked region (e.g., over non-planar bodies 206). The additional mask material may then be removed, and a second recess etch of the planar mask material performed to reach some first target depth within some first regions (e.g., over non-planar bodies 206), and reach some second target depth within some second regions (e.g., over non-planar bodies 207).

Figure 7:
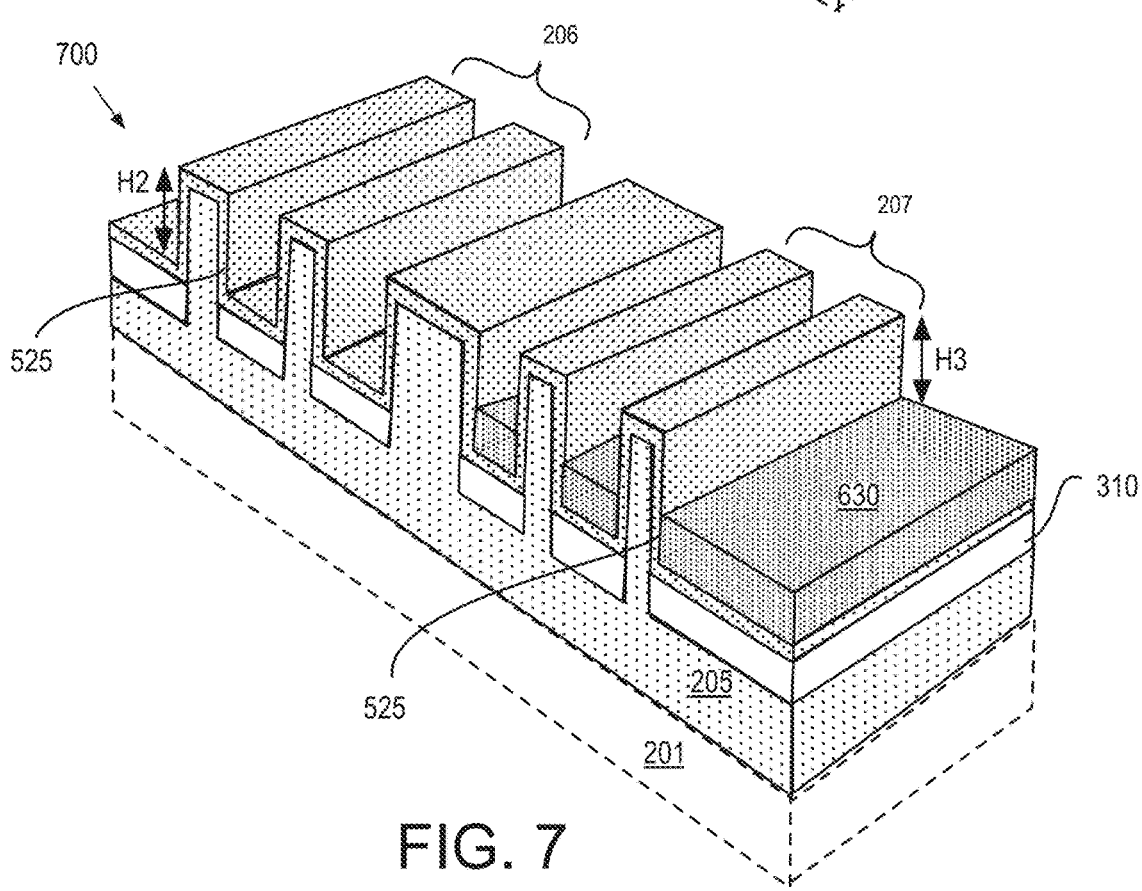

In transistor structures 700 illustrated in FIG. 7, mask material 630 over transistor structures 600 is completely recessed around non-planar bodies 206 to fully expose catalytic material 525 within the sidewall height H2, while mask material 630 is only partially recessed around non-planar bodies 207 to expose catalytic material 525 within the sidewall height H3. Sidewall height H3 is less than H2, and may vary arbitrarily to achieve any desired transistor channel width. Mask material 630 may be further recessed to any number of other levels, for example exposing sidewalls of other non-planar bodies to any heights that fall between sidewall height H2 and sidewall height H3, or exceed sidewall height H3, etc.

Returning to FIG. 1B, methods 101 continue at block 150 where exposed portions of the oxidation catalyst are removed, thereby exposing underlying semiconductor material of the non-planar bodies. Any wet chemical and/or dry etch process known to be selective to the catalyst over the semiconductor material underlying the catalyst may be employed at block 150. The portions of the non-planar bodies where the semiconductor material is exposed are to become an active, channel portion of a transistor structure while the portions of the non-planar bodies left covered with the oxidation catalyst are to become an inactive, dielectric portion of a transistor structure. Hence, the gradations in the mask material recess will dictate gradation in the relative apportionment of catalyst over a non-planar body height.

Figure 8:
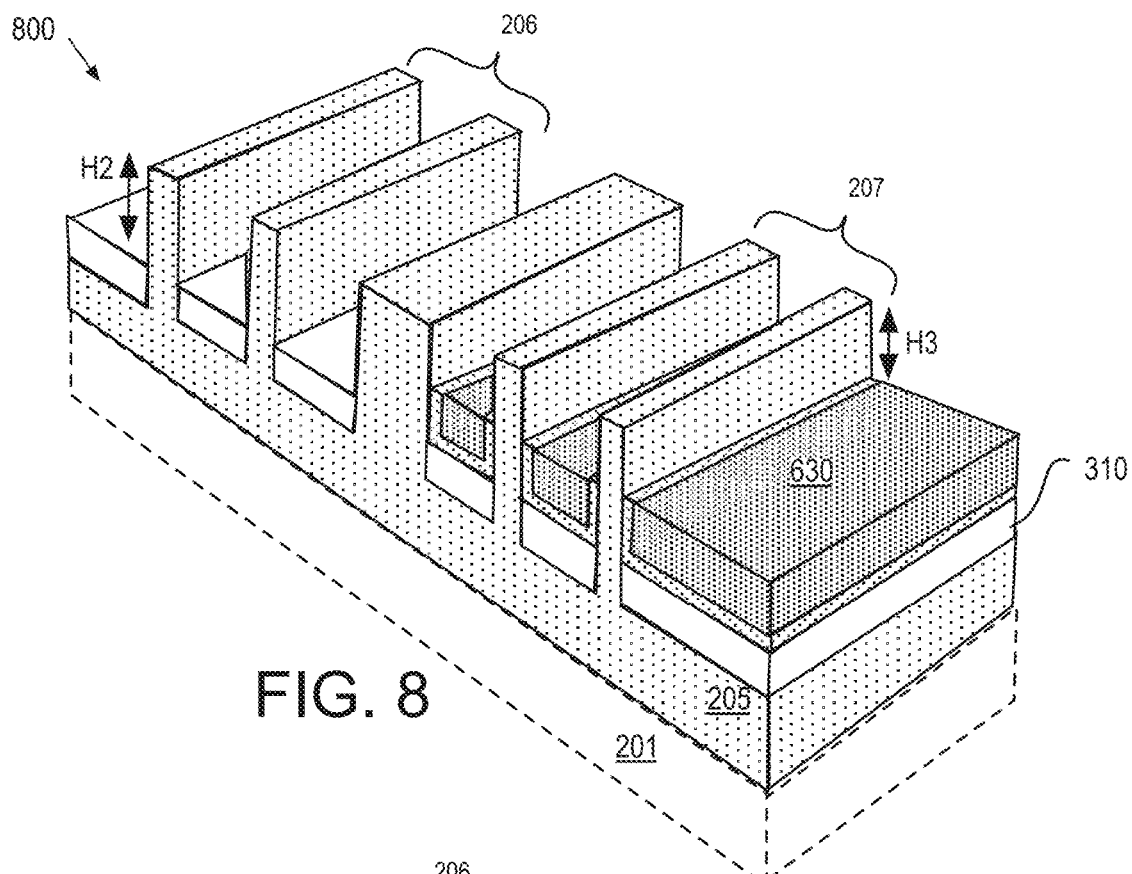
Figure 9:
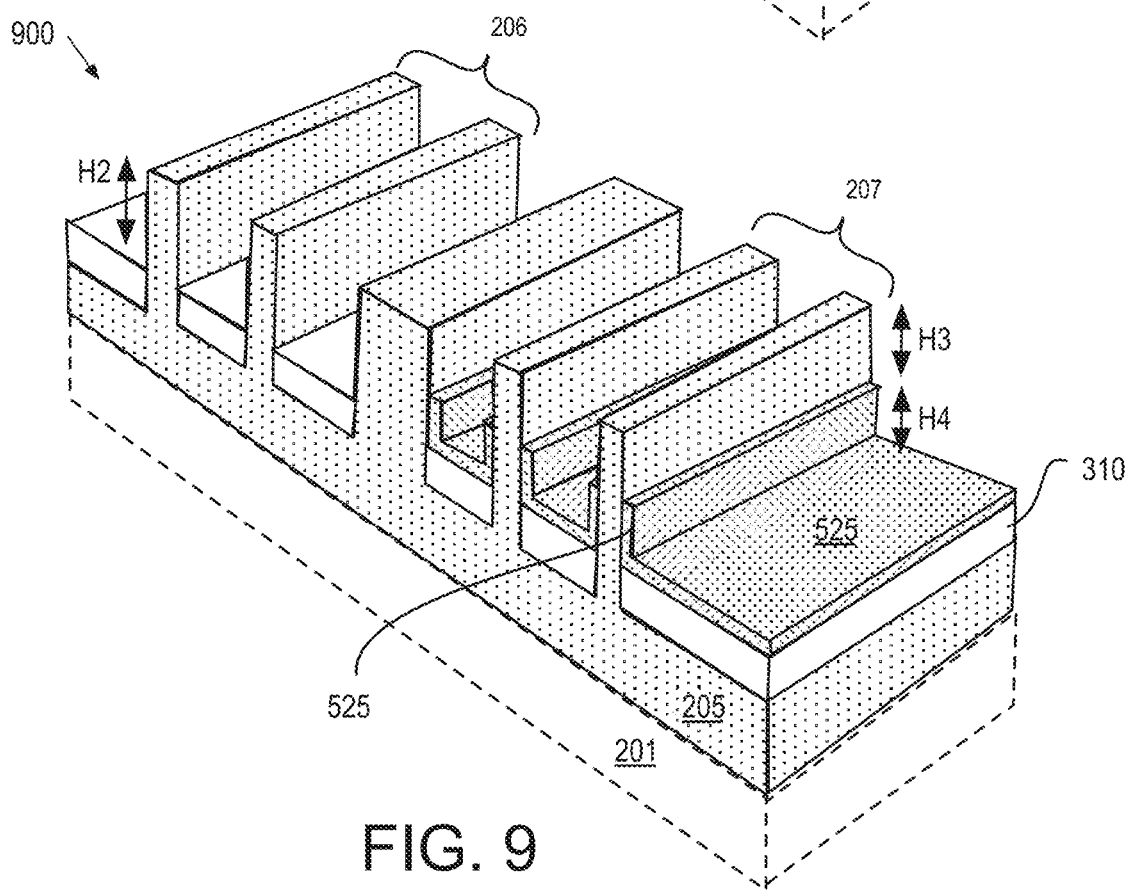

Following patterning of the catalyst, the mask material may then be removed at block 160 to expose the oxidation catalyst within regions where it has been retained. In the example of FIG. 8, transistor structures 800 include transistor structures 700 following a selective removal of catalyst material 525 that was not protected by mask material 630. As shown, sidewall height H2 of non-planar bodies 206 is now fully exposed while the smaller sidewall height H3 of non-planar bodies 207 is exposed. As further illustrated for transistor structures 900 in FIG. 9, upon removing mask material 630 from transistor structures 800, catalyst material 525 remains over a lower sidewall height H4 of non-planar bodies 207 while no catalyst material is present over non-planar bodies 206. Intervening non-planar body 208 has two distinct sidewalls, one with a sidewall height H2 that lacks any catalyst material 525, and other that has catalyst material 525 over sidewall height H4.

Returning to FIG. 1B, methods 101 continue at block 170 where the active sidewall height is reduced from the initial sidewall height that was defined at block 110, and common to all semiconductor bodies, to a menu of active sidewall heights that correspond to different proportions of the initial sidewall height. The reduction in active sidewall height may be achieved through an oxidation process that oxidizes the semiconductor material underlying the catalyst more completely and/or rapidly than the semiconductor material that lacks an overlying catalyst and is instead directly exposed to the oxidizing environment. Hence the oxidation process is not capable of significantly oxidizing non-catalyzed semiconductor material, beyond, for example, the formation of a thin native oxide. The oxidation process performed at block 170 may subject the transistor structures to any elevated temperature (e.g., 100-500° C.) in the presence of any oxidizing media (e.g., $O_2$, $O_3$, $H_2O$ vapor, $NO_R$, etc.) for any process duration required to fully oxidize the catalyzed semiconductor material into a non-semiconducting (i.e., dielectric material). Once the oxidation process has been completed, the remaining catalyst may be stripped, for example with the same process employed to pattern the catalyst at block 150.

Figure 10:
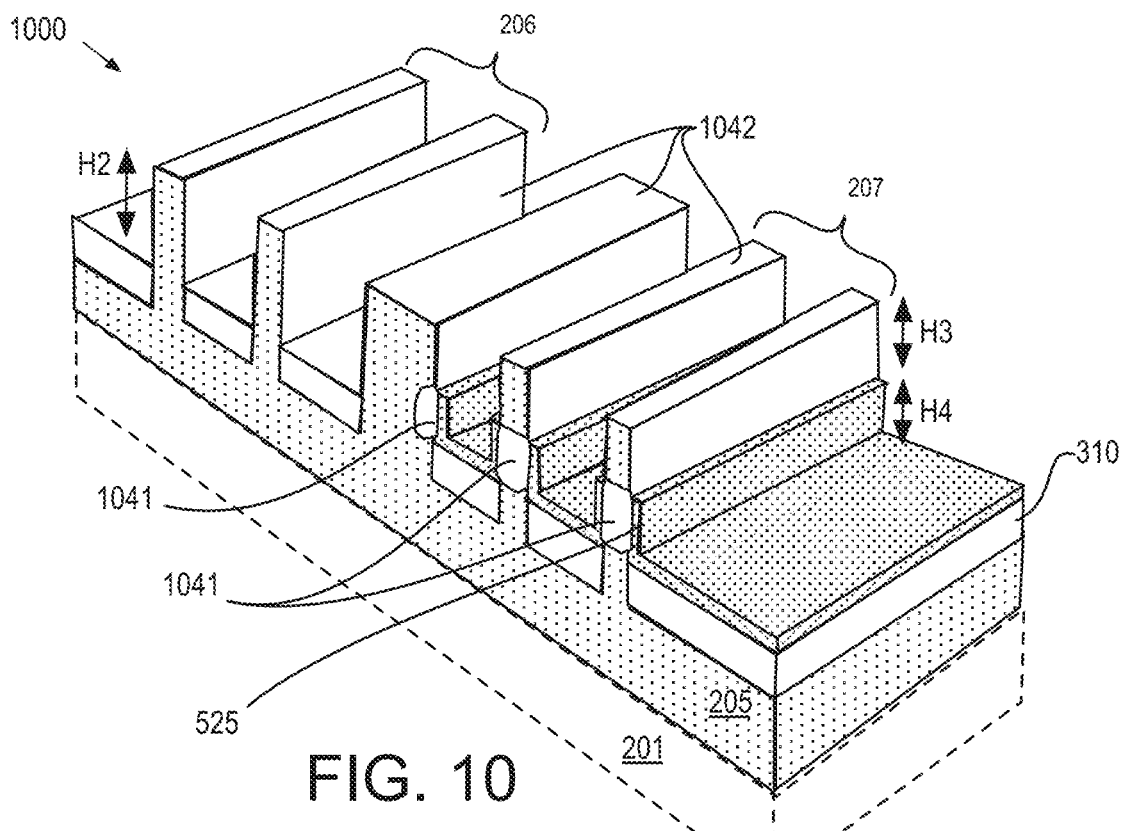

In the exemplary transistor structures 1000 illustrated in FIG. 10, a catalytic oxidation of transistor structures 900 has been performed to generate a native oxide 1042 (e.g., having a thickness of 1 nm, or less) on exposed semiconductor surfaces of non-planar bodies 206 (e.g., over the entire sidewall height H2). Native oxide 1042 is similarly over sidewall height H3 of non-planar bodies 207. Oxidation of semiconductor material underlying catalyst material 525 has been enhanced however, such that an oxide 1041 spans the entire transverse width $W_f$ of non-planar bodies 207 along at least the sidewall height H4. As such, oxide 1041 may electrically isolate the overlying active region of non-planar bodies 207 (e.g., sidewall height H3) from substrate material 205. In the absence of oxide 1041, the active region of non-planar bodies 206 remains in contact with substrate material 205. Intervening non-planar body 208 includes oxide 1041 proximal to the sidewall covered with catalyst material 525 over sidewall height H4. As depicted, oxide 1041 has a significantly greater thickness than native oxide 1042. In some embodiments, oxide 1041 has a thickness exceeding half the transverse width $W_f$, which may be most evident within intervening non-planar body 208 that is shown to have too large of a transverse width to be fully oxidized. In some embodiments, oxide 1041 has a thickness of at least 6-8 nm such that when opposite sidewalls of a non-planar body are oxidized, a transverse width $W_f$ of 15 nm, or more, is completely converted into a dielectric material.

The oxide 1041 comprises at least oxygen and all the constituents of semiconductor material from which non-planar bodies 207 were formed, and which remains within the non-catalyzed sidewall height H3. In some embodiments, oxide 1041 has substantially the same composition as native oxide 1042. In some such embodiments where non-planar bodies 206 and 207 comprise substantially pure silicon (e.g., monocrystalline silicon), oxide 1041 (and native oxide 1042) comprises silicon and oxygen (e.g., amorphous $SiO_2$). In other embodiments where non-planar bodies 206 and 207 comprise substantially pure Ge (e.g., monocrystalline Ge), oxide 1041 comprises germanium and oxygen (e.g., amorphous $GeO_2$). In other embodiments where non-planar bodies 206 and 207 comprise a SiGe alloy, oxide 1041 comprises silicon, germanium, and oxygen (e.g., amorphous $SiO_2$ and amorphous $GeO_2$). In still other embodiments where non-planar bodies 206 and 207 comprise a III-V alloy, oxide 1041 comprises a Group III-oxide and a Group V oxide.

Figure 11:
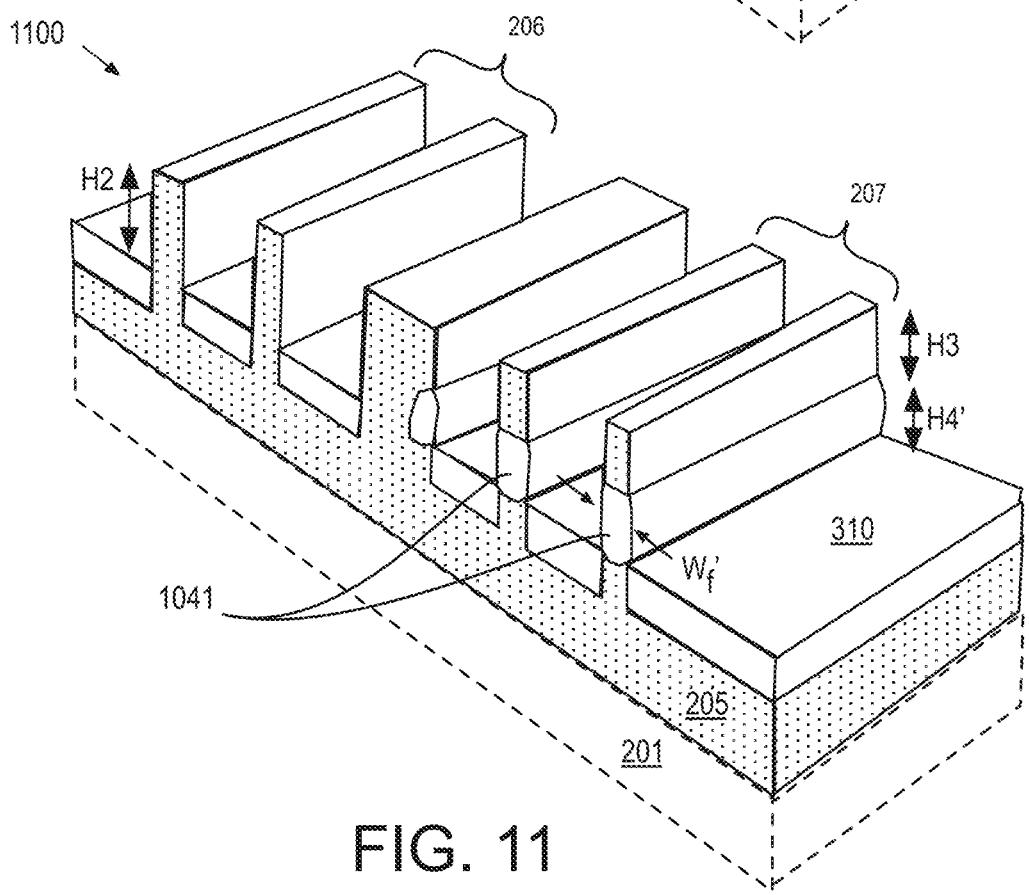

FIG. 11 further illustrates transistor structures 1100 after catalyst material 525 has been stripped from transistor structures 1000. As shown, oxide 1041 spans the entire longitudinal length of non-planar bodies 207 with the entire longitudinal length of non-planar bodies 206 substantially free of oxide 1041 (i.e., only native oxide 1042). As semiconductor material is oxidized to form oxide 1041, the oxidized non-planar body portion oxidized (e.g., along sidewall height H4) may undergo volumetric expansion. As such, the transverse width of oxide 1041 may increase from transverse width $W_f$ to transverse width $W_f'$. For example, for a monocrystalline silicon non-planar body 207, an inactive portion that is oxidized into $SiO_2$ may have a volumetric change of approximately 50%. A non-planar body 207 with an exemplary $W_f$ of 6 nm may then be converted into oxide 1041 with an expanded $W_f'$ of 8-9 nm. Depending on a pitch of semiconductor bodies 207, the lateral expansion of oxide 1041 may result in oxide 1041 of adjacent fins making contact with each other (not depicted). Along with an increase in width (and length), sidewall height H4 may also increase to an expanded sidewall height H4'. A non-planar body 207 with an exemplary H4 of 10 nm may then be converted into oxide 1041 with an expanded H4' of 13-15 nm.

Figure 12:
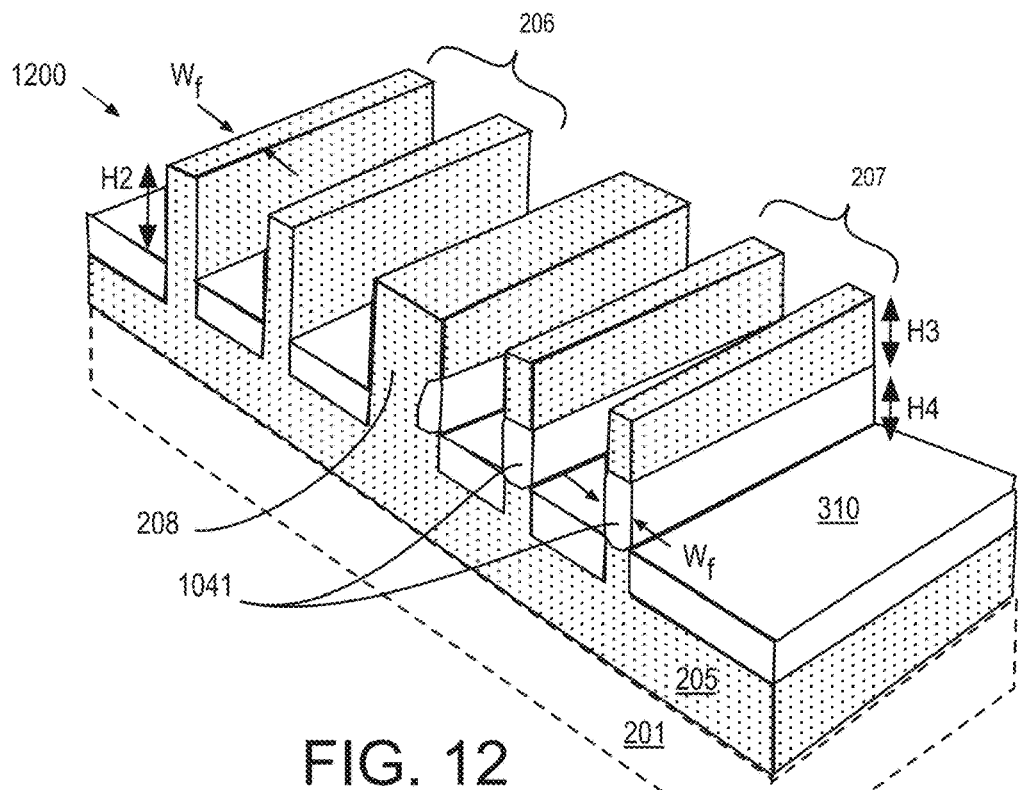

In some embodiments, at least a portion of the oxide formed during the catalytic oxidation process is stripped off. For example, an isotropic (e.g., wet chemical) etch may be performed to remove native oxide and/or reduce lateral encroachment of adjacent inactive regions. An anisotropic (e.g., plasma) etch, such as any suitable spacer dielectric etch may also be performed, in addition to, or in the alternative to, an isotropic etch. An anisotropic etch may, for example, mitigate or completely eliminate any lateral expansion associated with oxidizing semiconductor material. FIG. 12, for example, further illustrates transistor structures 1200 after native oxide 1042 has been stripped from transistor structures 1100. Following the removal of 1-2 nm of oxide, for example, semiconductor material of non-planar bodies 206 and 207 is exposed. Transverse width $W_f$ may at this point be slightly reduced, for example by ~1 nm. As further shown, oxide 1041 has also been etched back, e.g., with the same etchant that removed native oxide 1042, to return transverse width $W_f'$ to transverse width $W_f$.

Returning to FIG. 1B, methods 101 continue at block 180 where transistor terminals, such as a gate electrode and source/drain terminals, are formed adjacent to the active sidewall height. Gate electrode fabrication may be according to any "gate first" or "gate last" techniques. As noted above, the gate electrode fabrication may be based on the initial sidewall height as that height remains applicable to all non-planar bodies since the apportionment of the initial sidewall height varies to a greater extent than the total sidewall height itself. As such, all transistor structures, regardless of their channel widths may comprise substantially the same gate electrode structure. The gate electrode structure having some predetermined height suitable for all transistor structures may overlap an inactive portion of a non-planar body by more or less according to the active/inactive apportionment of the non-planar body height.

Source and drain fabrication may be according to any impurity doping and/or epitaxial growth techniques. The source and drain fabrication may also be based on the total non-planar body sidewall height. However, unlike the gate electrode, the same source/drain semiconductor structures may vary along with that of the transistor channels to which they are coupled. More specifically, a source and drain structure may have heights that correspond with heights of only the active portion of a non-planar body with the source and drain structures seated on an inactive portion of the non-planar semiconductor body. Methods 101 then complete at block 190, for example, with the fabrication of ILD and interconnect metallization levels according to any known techniques.

Figure 13:
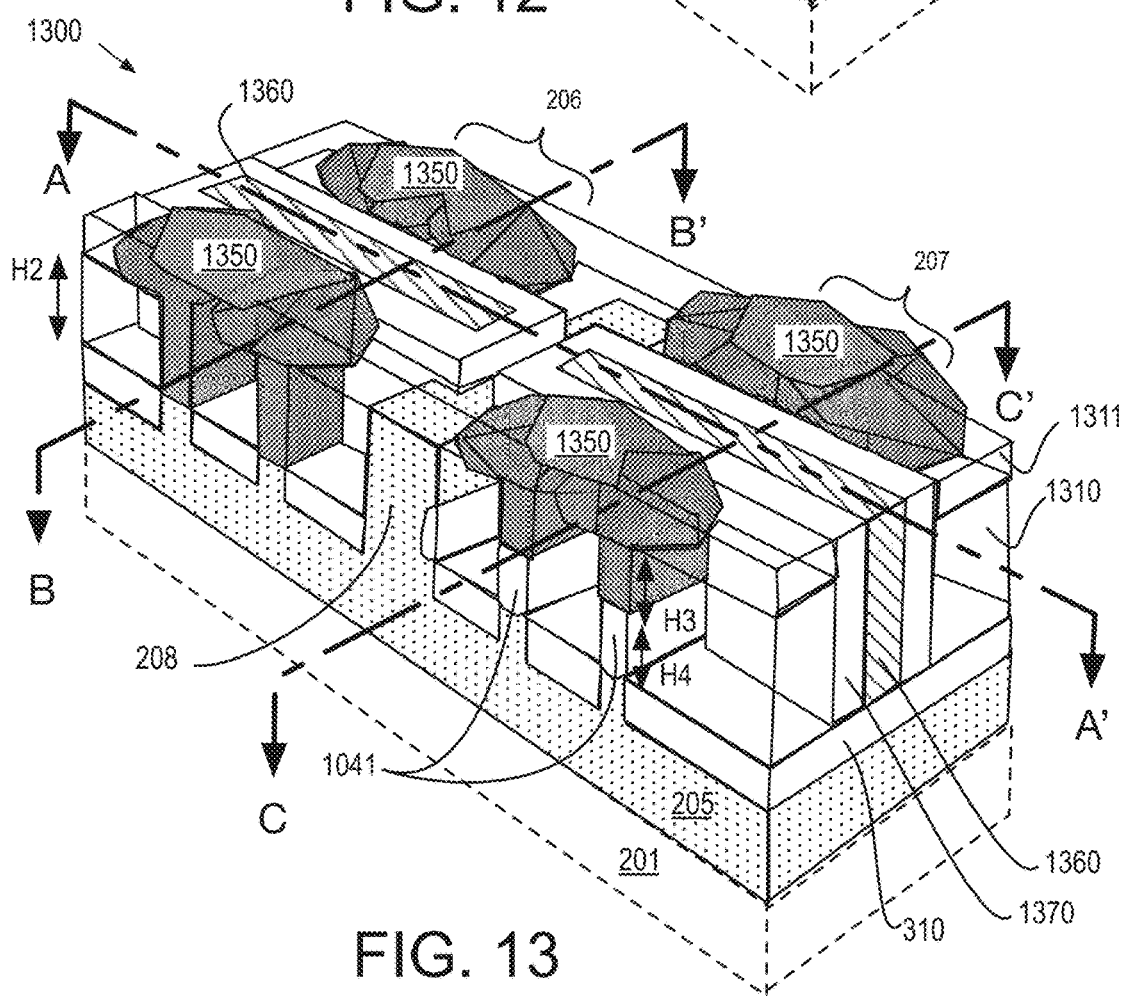
Figure 14A:
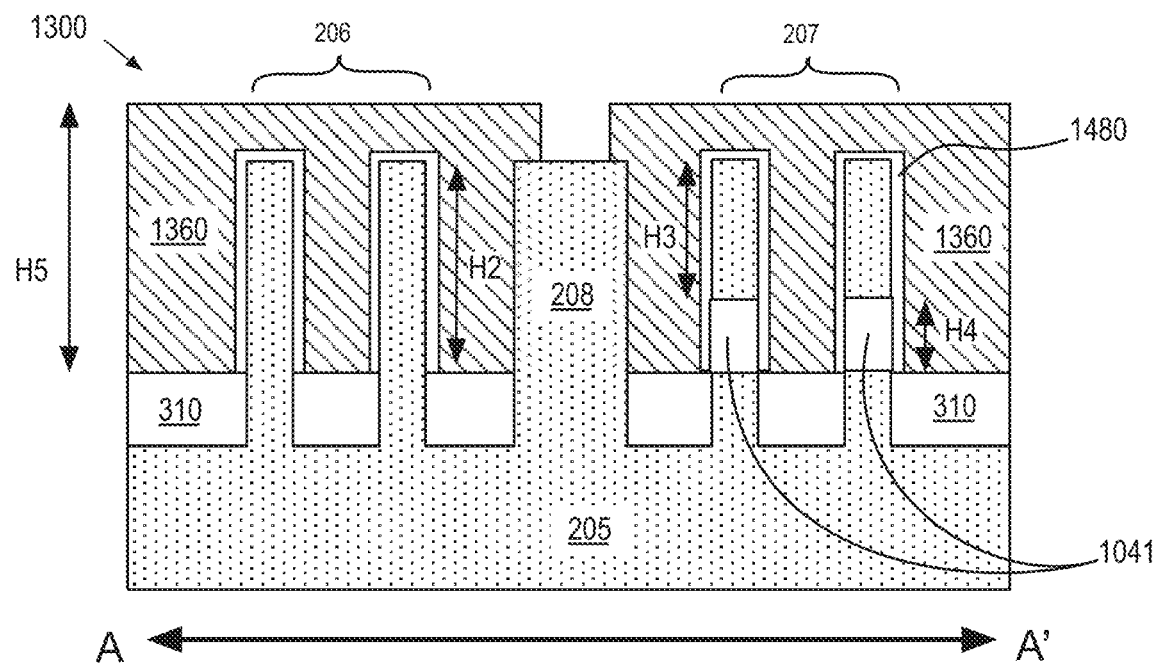
FIGS. 14A, 14B and 14C illustrate cross-sectional views of the transistor structures shown in FIG. 13, in accordance with some embodiments.
Figures 14B, 14C:
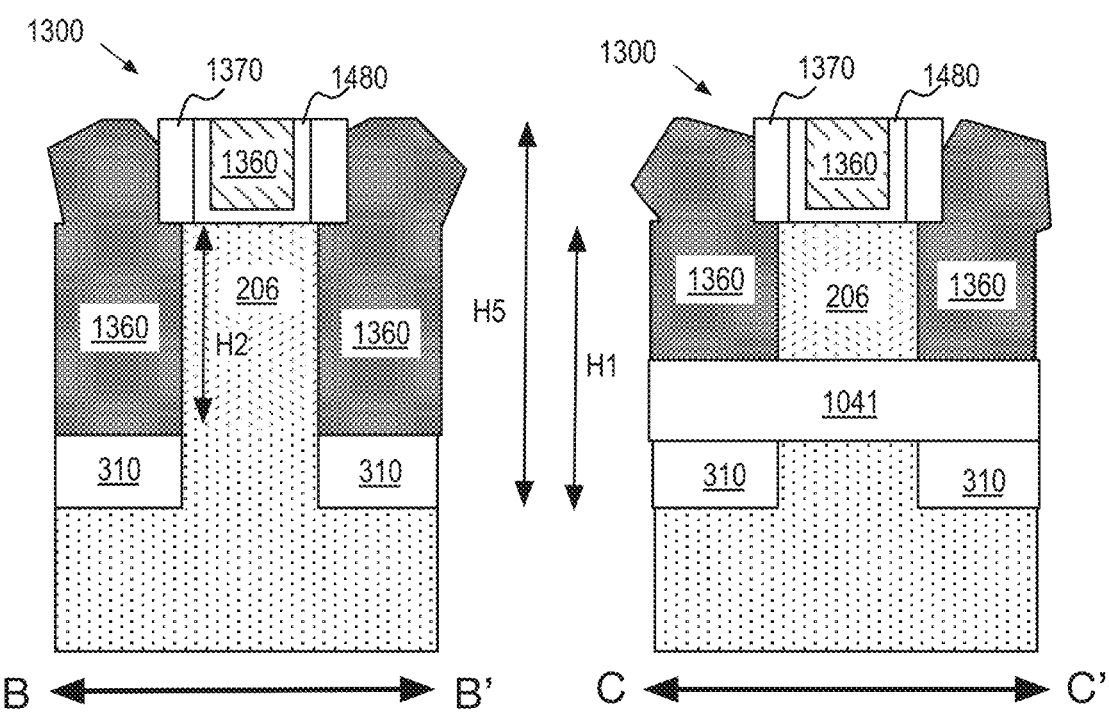

An isometric view of transistor structures 1300 is illustrated in FIG. 13. Transistor structures 1300 include transistor structures 1200 following the formation of the device terminals. FIGS. 14A, 14B and 14C further illustrate cross-sectional views of the transistor structures shown in FIG. 13, in accordance with some embodiments. The various cross-sectional views are taken along the planes demarked by dashed lines in FIG. 13. As shown, transistor structures 1300 include two gate electrodes 1360 separated from each other by intervening non-planar body 208. Transistor structures 1300 therefore include two separate transistor structures. A first transistor structure comprises multiple (e.g., two) non-planar bodies 206 that have a first active sidewall height H2, associated with a larger channel width. A second transistor structure comprises multiple (e.g., two) non-planar bodies 207 that have a second active sidewall height H3, associated with a smaller transistor channel width.

Gate electrodes 1360 are over a channel region of bodies 206-207, and separated from the channel region by a gate dielectric 1480 (FIG. 14A-14C). In some exemplary embodiments gate dielectric 1480 includes a high-k material (with a bulk relative permittivity greater than 9), and gate electrode 1360 includes a metal having a work function suitable for semiconductor bodies 206 and 207. Exemplary high-k materials include metal oxides, such as, but not limited to a metal oxide comprising predominantly aluminum (e.g., $Al_2O_3$), a metal oxide comprising predominantly magnesium (e.g., MgO), a metal oxide comprising predominantly lanthanum (e.g., $La_2O_3$), a metal oxide comprising predominantly hafnium (e.g., $HfO_2$), or an alloy metal oxide comprising significant portions of two or more of these metals (e.g., $HfAlO_x$). In some further embodiments, the high-k material further includes silicon. For example, metal silicates, such as, but not limited to $HfSiO_x$, or $TaSiO_x$ may also be suitable for some semiconductor body compositions (e.g., Si, Ge, SiGe, III-V). Gate electrode 1360 may include a semiconductor (e.g., polycrystalline silicon), an elemental metal layer, a metal alloy layer, or laminate structure of any of these materials. In some embodiments, gate electrode 1360 is a metal nitride, such as TiN (e.g., 4.0-4.7 eV). Gate electrode 1360 may also comprise Al (e.g., TiAlN). Other alloy constituents may also be employed in a gate electrode, such as, but not limited to, C, Ta, W, Pt, and Sn.

Each gate electrode 1360 is separated for source and drain semiconductor 1350 by a gate sidewall spacer 1370. Gate sidewall spacer 1370 may be any dielectric material(s) known to be suitable as an insulator of a gate electrode, such as, but not limited to SiO, SiON, SiOC. Source and drain semiconductor 1350 may be epitaxially grown from a seeding surface of semiconductor bodies 206 and 207, that in this example have been recessed within a surrounding dielectric material 1310. Following the epitaxially source/drain semiconductor growth, top surfaces of source and drain semiconductor 1350 may be planarized with any suitable (e.g., low-k) dielectric material 1311. Dielectric materials 1310 and 1311 may be any dielectric materials suitable for electrical isolation of transistors such as, but not limited to, SiO, SiON, SiOC, hydrogen silsesquioxane, methyl silsesquioxane, polyimide, polynorbornenes, benzocyclobutene, or the like. Dielectric materials 1301 and 1311 may be deposited, as a flowable oxide, for example.

Although source and/or drain semiconductor material 1350 may have any semiconductor composition, in some embodiments where bodies 206 and 207 are substantially pure silicon, source and/or drain semiconductor material 1350 is also substantially pure silicon, having sufficient impurity doping concentration to achieve desired conductivity type (e.g., N-type for NMOS and p-type for PMOS) and density of states. In some exemplary PMOS embodiments, bodies 206 may be substantially pure silicon wherein source and/or drain semiconductor material 1350 is a SiGe alloy (that may comprise predominantly silicon, or predominantly germanium). Regardless of majority lattice composition and conductivity type, source and/or drain semiconductor material 1350 is advantageously doped to have an electrically active impurity concentration that is higher than that of the channel region of bodies 206 and 207. In some specific embodiments, the impurity concentration is in the range of $2e^{20}$-$1e^{21}$ atoms/cm$^3$. Source and/or drain semiconductor material 1350 may have an electrically active impurity concentration that ensures a conductivity type complementary to that of the channel portion. In some exemplary NMOS embodiments, source and/or drain semiconductor material 1350 comprises an N-type dopant, such as, but not limited to phosphorus. In an exemplary PMOS embodiment illustrated, source and/or drain semiconductor material 1350 comprises a P-type dopant, such as, but not limited to, boron.

With epitaxial growth, source and/or drain semiconductor material 1350 has crystallinity associated with that of bodies 206, 207 and/or substrate material layer 205. For example, where bodies 206-207 and/or substrate material layer 205 have cubic crystallinity of a given orientation, source and/or drain semiconductor material 1350 may also have cubic crystallinity with that same orientation, particularly for advantageous embodiments where source and/or drain semiconductor material 1350 is monocrystalline. Even for alternative embodiments where source and/or drain semiconductor material 1350 is only polycrystalline, epitaxially grown source and/or drain semiconductor material 1350 may have texture favoring the crystallinity of bodies 206-207.

As shown, the channel portion of semiconductor bodies 206 has a channel sidewall height of H2 over which gate electrode 1360 is adjacent to a sidewall of bodies 206. In contrast, the channel portion of semiconductor bodies 207 has a channel sidewall height of only H3 over which gate electrode 1360 is adjacent to a sidewall of bodies 207. Regardless of the channel sidewall height variation, gate electrode 1360 has substantially the same vertical height H5, for example as measured from an interface with field isolation 310. The majority of the difference between H2 and H3 is made up by overlap between gate electrode 1360 and inactive sidewall height H4.

Figure 15:
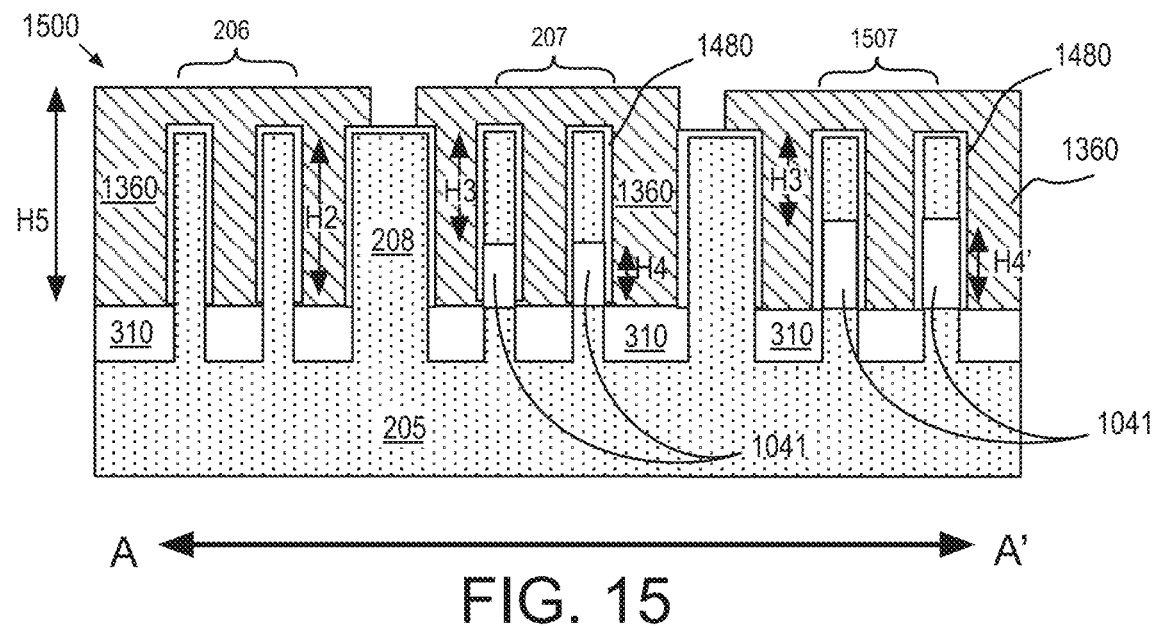
FIG. 15 illustrates a cross-sectional view of transistor structure including non-planar bodies having variable, and complementary, semiconductor and insulator portions, in accordance with some embodiments.

Notably, while only two transistor structures are illustrated in FIG. 2-14, any number of transistor structures may similarly have any number of different active sidewall heights, for example ranging between H2 and H3. In some embodiments, for example, all transistors of an IC may include non-planar bodies that include at least some inactive portion (i.e., all have a non-zero sidewall height H4). FIG. 15 illustrates a cross-sectional view of transistor structure including three sets of non-planar bodies 206, 207 and 1507 having variable, and complementary, semiconductor and insulator portions, in accordance with some embodiments. As shown non-planar bodies 1507 have a third apportionment of active and inactive regions where active sidewall height H4' is larger than active sidewall height H4 and inactive sidewall height H3' is correspondingly smaller than inactive sidewall height H3.

Figure 16:
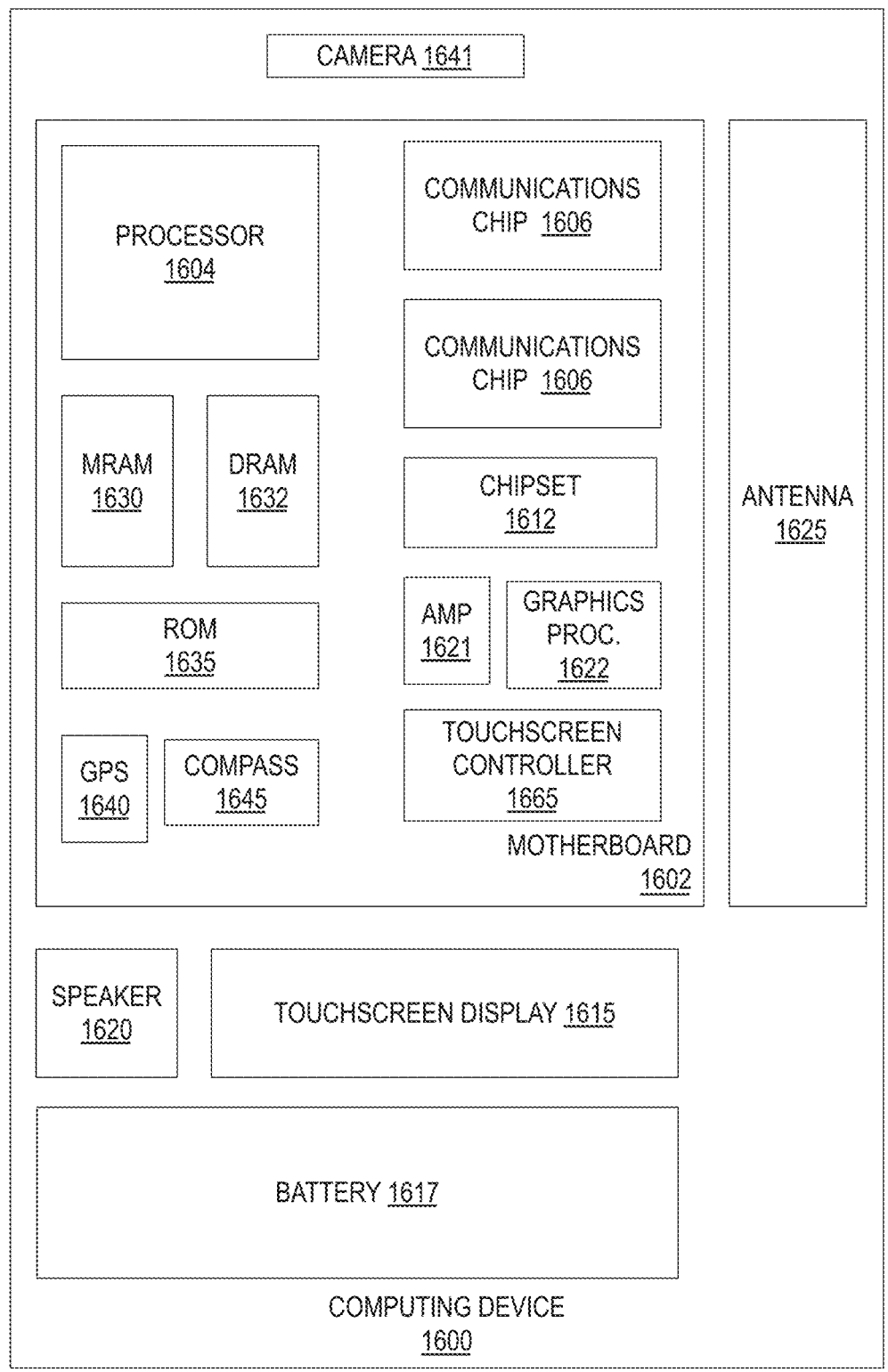
FIG. 16 is a functional block diagram of an electronic computing device, in accordance with some embodiments.

FIG. 16 is a functional block diagram of an electronic computing device 1600, in accordance with some embodiments. Device 1600 further includes a motherboard 1602 hosting a number of components, such as, but not limited to, a processor 1604 (e.g., an applications processor). Processor 1604 may be physically and/or electrically coupled to motherboard 1602. In some examples, processor 1604 includes a transistor structure with a non-planar body having variable & complementary semiconductor and insulator portions, for example as described elsewhere herein, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1606 may also be physically and/or electrically coupled to the motherboard 1602. In further implementations, communication chips 1606 may be part of processor 1604. Depending on its applications, computing device 1600 may include other components that may or may not be physically and electrically coupled to motherboard 1602. These other components include, but are not limited to, volatile memory (e.g., DRAM 1632), non-volatile memory (e.g., ROM 1635), flash memory (e.g., NAND or NOR), magnetic memory (MRAM 1630), a graphics processor 1622, a digital signal processor, a crypto processor, a chipset 1612, an antenna 1625, touchscreen display 1615, touchscreen controller 1665, battery 1617, audio codec, video codec, power amplifier 1621, global positioning system (GPS) device 1640, compass 1645, accelerometer, gyroscope, speaker 1620, camera 1641, and mass storage device (such as hard disk drive, solid-state drive (SSD), compact disk (CD), digital versatile disk (DVD), and so forth), or the like. In some exemplary embodiments, at least one of the functional blocks noted above comprise an IC having a transistor structure includes a non-planar body having variable & complementary semiconductor and insulator portions, for example as described elsewhere herein.

Communication chips 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1606 may implement any of a number of wireless standards or protocols, including but not limited to those described elsewhere herein. As discussed, computing device 1600 may include a plurality of communication chips 1606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 17:
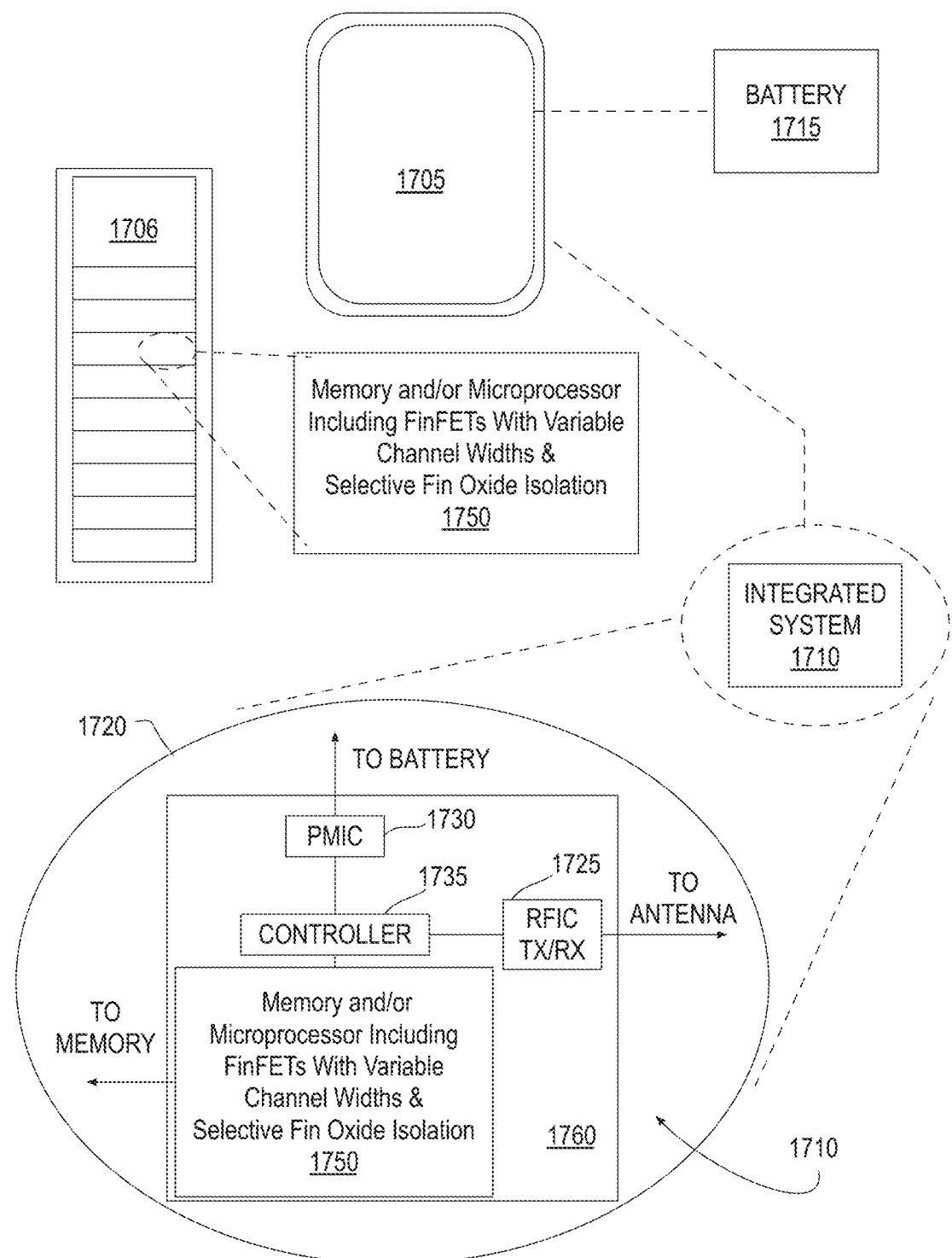
FIG. 17 is a diagram of an exemplary platform having circuitry with transistors that include a non-planar body having variable, and complementary, semiconductor and insulator portions, in accordance with some embodiments.

FIG. 17 is a diagram of an exemplary platform 1705 including an IC having a transistor structure that includes a non-planar body having variable & complementary semiconductor and insulator portions, for example as described elsewhere herein. Computing device 1600 may be found inside platform 1705 or server machine 1706, for example. The server machine 1706 may be any commercial server, for example including any number of high-performance computing platforms disposed within a rack and networked together for electronic data processing, which in the exemplary embodiment includes a packaged SoC 1750 that further includes a transistor structure with back-side contact metallization to deep source and/or drain semiconductor, for example as described elsewhere herein. The mobile computing platform 1705 may be any portable device configured for each of electronic data display, electronic data processing, wireless electronic data transmission, or the like. For example, the mobile computing platform 1705 may be any of a tablet, a smart phone, laptop computer, etc., and may include a display screen (e.g., a capacitive, inductive, resistive, or optical touchscreen), a chip-level or package-level integrated system 1710, and a battery 1715.

Whether disposed within the integrated system 1710 illustrated in the expanded view 1720, or as a stand-alone chip within the server machine 1706, IC package 1750 may include a transistor structure with back-side contact metallization to deep source and/or drain semiconductor, for example as described elsewhere herein. IC package 1750 may be further coupled to a board, a substrate, or an interposer 1760 along with, one or more of a power management integrated circuit (PMIC) 1730, RF (wireless) integrated circuit (RFIC) 1725 including a wideband RF (wireless) transmitter and/or receiver (TX/RX) (e.g., including a digital baseband and an analog front end module further comprises a power amplifier on a transmit path and a low noise amplifier on a receive path), and a controller 1735.

Functionally, PMIC 1730 may perform battery power regulation, DC-to-DC conversion, etc., and so has an input coupled to battery 1715 and with an output providing a current supply to other functional modules. As further illustrated, in the exemplary embodiment, RFIC 1725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) structure comprises a first transistor structure comprising a first non-planar body over a substrate, the first non-planar body comprising a first active portion over a first inactive portion, the first active portion comprising a semiconductor material and the first inactive portion comprising a dielectric material. The first transistor structure comprising a first gate electrode adjacent to a first sidewall of the first active region, and a first source and a first drain on opposite sides of the first gate electrode. The IC structure further comprises a second transistor structure, comprising a second non-planar body over the substrate, the second non-planar body comprising a second active portion over a second inactive portion, the second active portion comprising the semiconductor material and the second inactive portion comprising the dielectric material. The second transistor structure comprising a second gate electrode adjacent to a second sidewall of the second active region, and a second source and a second drain on opposite sides of the second gate electrode, wherein the first active portion is less than the second active portion, and the first inactive portion is greater than the second inactive portion.

In second examples, for any of the first examples the first sidewall has a first height, the second sidewall has a second height, greater than the first height. The first inactive region has a third sidewall of a third height, and the second inactive region has a fourth sidewall of a fourth height that is less than the third height.

In third examples, for any of the second examples the first and second sidewall heights differ by at least 25%, and a sum of the first height and the second height differs by no more than 10% from a sum of the third height and fourth height.

In fourth examples, for any of the second through third examples the first gate electrode is adjacent to the second sidewall, and the second gate electrode is adjacent to the fourth sidewall.

In fifth examples, for any of the first through fourth examples, the dielectric material comprises an oxide of the semiconductor material.

In sixth examples, for any of the first through the fifth examples the semiconductor material comprises predominantly silicon, and the dielectric material comprises silicon and oxygen.

In seventh examples, for any of the first through the sixth examples the IC structure further comprises a third transistor structure, comprising a third non-planar body over the substrate, the third non-planar body comprising a third active portion in contact with the substrate, the third active portion and the substrate comprising the semiconductor material. The third transistor structure comprising a third gate electrode adjacent to a third sidewall of the third active region, and a third source and a third drain on opposite sides of the third gate electrode.

In eighth examples, the first source and first drain comprise semiconductor material that is over a top surface of the first inactive portion, and wherein the second source and second drain comprise semiconductor material that is over a top surface of the second inactive portion.

In ninth examples, for any of the first through the eighth examples, the substrate comprises the semiconductor material, the first non-planar body comprises a first sub-fin portion between the first inactive portion and the substrate, the second non-planar body comprises a second sub-fin portion between the second inactive portion and the substrate, and the first and second sub-fin portions comprise the semiconductor material.

In tenth examples, for any of the first through the ninth examples the first and second active portions each have a first transverse width that is less than 15 nm, and the first and second inactive portions each have a second transverse width that is at least 50% larger than the first transverse width.

In eleventh examples, an integrated circuit (IC) structure comprises a plurality of transistor structures, individual ones of the plurality comprising a non-planar body over a substrate, a gate electrode adjacent to a sidewall of an active region of the non-planar body, and a source and drain on opposite sides of the gate electrode. A height of the sidewall of the active region varies across the plurality, and height of a sidewall of an inactive region separating the active region from the substrate varies inversely with the height of the sidewall of the active region.

In twelfth examples, for any of the eleventh examples the plurality of transistor structures comprises a first transistor structure, comprising a first non-planar body over the substrate, the first non-planar body comprising a first active portion over an inactive portion, the first active portion comprising a semiconductor material and the inactive portion comprising a dielectric material. The first transistor structure comprises a first gate electrode adjacent to a first sidewall of the first active region, and a first source and a first drain on opposite sides of the first gate electrode. The plurality comprises a second transistor structure, comprising a second non-planar body over the substrate, the second non-planar body comprising a second active portion over, and in contact with, the substrate, the second active portion and the substrate both comprising the semiconductor material. The second transistor structure comprises a second gate electrode adjacent to a second sidewall of the second active region, and a second source and a second drain on opposite sides of the second gate electrode.

In thirteenth examples, for any of the twelfth examples, the plurality of transistor structures further comprises a third transistor structure, comprising a third non-planar body over the substrate, the third non-planar body comprising a third active portion over a second inactive portion, the third active portion comprising the semiconductor material and the second inactive portion comprising the dielectric material. The third transistor structure comprises a third gate electrode adjacent to a sidewall of the third active region, and a third source and a third drain on opposite sides of the third gate electrode. The first active portion is less than the third active portion, and the first inactive portion is greater than the second inactive portion.

In fourteenth examples, a computing platform comprises the IC of any of the twelfth through thirteenth examples, and a power supply coupled to the IC.

In fifteenth examples, a method of fabricating a transistor structure comprises forming first and second non-planar bodies on a substrate, the non-planar bodies each comprising a semiconductor material. The method comprises depositing an oxidation catalyst over the first and second non-planar bodies, patterning the oxidation catalyst to remain only over a lower portion of at least one of the first or second non-planar bodies, oxidizing the lower portion of the first or second non-planar bodies covered with the oxidation catalyst to form an inactive portion of the non-planar bodies, forming a gate electrode over an active portion of each of the first and second non-planar bodies, and forming a source region and a drain coupled to each of the first and second non-planar bodies.

In sixteenth examples, for any of the fifteenth examples depositing the oxidation catalyst comprises depositing a material comprising metal and oxygen.

In seventeenth examples, for any of the fifteenth through sixteenth examples the metal comprises at least one of Al, La, or Ta.

In eighteenth examples, for any of the fifteenth through seventeenth examples the semiconductor material comprises predominantly silicon, and the inactive portion comprises $SiO_2$.

In nineteenth examples, for any of the fifteenth through eighteenth examples patterning the oxidation catalyst further comprises depositing a mask material, recessing the mask material to expose only a portion of a sidewall of the non-planar bodies, removing the oxidation catalyst that is not masked by the mask material, and removing the mask material to expose a remainder of the oxidation catalyst.

In twentieth examples, for any of the fifteenth through nineteenth examples the method further comprises recessing a sidewall of the inactive portion of the non-planar bodies for the inactive portion to have a transverse width no greater than that of the active portion.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
 a first transistor structure, comprising:
  a first non-planar body over a substrate, the first non-planar body comprising a first upper portion over a first lower portion, the first upper portion comprising a semiconductor material and the first lower portion comprising a dielectric material;
  a first gate electrode adjacent to a first sidewall of the first upper region; and
  a first source and a first drain on opposite sides of the first gate electrode;
 a second transistor structure, comprising:
  a second non-planar body over the substrate, the second non-planar body comprising a second upper portion over a second lower portion, the second upper portion comprising the semiconductor material and the second lower portion comprising the dielectric material;
  a second gate electrode adjacent to a second sidewall of the second upper region; and
  a second source and a second drain on opposite sides of the second gate electrode,
 wherein, within the non-planar bodies, a height of the first upper portion is less than a height of the second upper portion, and a height of the first lower portion is greater than a height of the second lower portion.

2. The IC structure of claim 1, wherein:
 the first sidewall has a first height;
 the second sidewall has a second height, greater than the first height;
 the first lower region has a third sidewall of a third height; and
 the second lower region has a fourth sidewall of a fourth height, smaller than the third height.

3. The IC structure of claim 2, wherein:
 the first and second sidewall heights differ by at least 25%; and
 a sum of the first height and the second height differs by no more than 10% from a sum of the third height and fourth height.

4. The IC structure of claim 2, wherein:
 the first gate electrode is adjacent to the second sidewall; and
 the second gate electrode is adjacent to the fourth sidewall.

5. The IC structure of claim 1, wherein the dielectric material comprises oxygen and an element of the semiconductor material.

6. The IC structure of claim 5, wherein the semiconductor material comprises predominantly silicon, and the dielectric material comprises silicon and oxygen.

7. The IC structure of claim 1, further comprising:
 a third transistor structure, comprising:
  a third non-planar body over the substrate, the third non-planar body comprising a third upper portion in contact with the substrate, the third upper portion and the substrate comprising the semiconductor material;
  a third gate electrode adjacent to a third sidewall of the third upper region; and
  a third source and a third drain on opposite sides of the third gate electrode.

8. The IC structure of claim 1, wherein the first source and first drain comprise semiconductor material that is over a top surface of the first lower portion, and wherein the second source and second drain comprise semiconductor material that is over a top surface of the second lower portion.

9. The IC structure of claim 1, wherein:
 the substrate comprises the semiconductor material;
 the first non-planar body comprises a first sub-fin portion between the first lower portion and the substrate;
 the second non-planar body comprises a second sub-fin portion between the second lower portion and the substrate; and
 the first and second sub-fin portions comprise the semiconductor material.

10. The IC structure of claim 1, wherein:
 the first and second upper portions each have a first transverse width that is less than 15 nm; and
 the first and second lower portions each have a second transverse width that is at least 50% larger than the first transverse width.

11. An integrated circuit (IC) structure, comprising a plurality of transistor structures, individual ones of the plurality comprising:
 a non-planar body over a substrate;
 a gate electrode adjacent to a sidewall of an active region of the non-planar body; and
 a source and drain on opposite sides of the gate electrode, wherein a height of the sidewall of the active region varies across the plurality, and height of a sidewall of an inactive region between the active region and the substrate varies inversely with the height of the sidewall of the active region.

12. The IC structure of claim 11, wherein the plurality of transistor structures comprises:
 a first transistor structure, comprising:
  a first non-planar body over a substrate, the first non-planar body comprising a first active portion over an inactive portion, the first active portion comprising a semiconductor material and the inactive portion comprising a dielectric material;
  a first gate electrode adjacent to a first sidewall of the first active region; and
  a first source and a first drain on opposite sides of the first gate electrode;
 a second transistor structure, comprising:
  a second non-planar body over the substrate, the second non-planar body comprising a second active portion over, and in contact with, the substrate, the second active portion and the substrate both comprising the semiconductor material;
  a second gate electrode adjacent to a second sidewall of the second active region; and
  a second source and a second drain on opposite sides of the second gate electrode.

13. The IC structure of claim 12, wherein the plurality of transistor structures further comprises:
 a third transistor structure, comprising:
  a third non-planar body over the substrate, the third non-planar body comprising a third active portion over a second inactive portion, the third active portion comprising the semiconductor material and the second inactive portion comprising the dielectric material;
  a third gate electrode adjacent to a sidewall of the third active region; and
  a third source and a third drain on opposite sides of the third gate electrode, wherein the first active portion is less than the third active portion, and the first inactive portion is greater than the second inactive portion.

14. A computing platform, comprising the IC of claim 12, and a power supply coupled to the IC.

* * * * *